US008818544B2

(12) United States Patent
Nehme et al.

(10) Patent No.: US 8,818,544 B2
(45) Date of Patent: Aug. 26, 2014

(54) SOLID IDENTIFICATION GRID ENGINE FOR CALCULATING SUPPORT MATERIAL VOLUMES, AND METHODS OF USE

(75) Inventors: Ziad A. Nehme, Knoxville, TN (US); Amer E. Mouawad, Knoxville, TN (US)

(73) Assignee: Stratasys, Inc., Eden Prairie, MN (US)

( * ) Notice: Subject to any disclaimer, the term of this patent is extended or adjusted under 35 U.S.C. 154(b) by 479 days.

(21) Appl. No.: 13/231,533

(22) Filed: Sep. 13, 2011

(65) Prior Publication Data

US 2013/0066812 A1  Mar. 14, 2013

(51) Int. Cl.
| | | |
|---|---|---|
| *G06F 17/00* | (2006.01) | |
| *B29C 67/00* | (2006.01) | |
| *G06T 17/00* | (2006.01) | |
| *G06T 17/10* | (2006.01) | |

(52) U.S. Cl.
CPC ......... *B29C 67/0088* (2013.01); *B29C 67/0092* (2013.01); *G06T 17/005* (2013.01); *G06T 17/10* (2013.01)
USPC .......................................... 700/119; 705/400

(58) Field of Classification Search
USPC ........... 700/98, 106, 117, 118, 119, 120, 182; 705/400; 703/1, 6; 264/401
See application file for complete search history.

(56) References Cited

U.S. PATENT DOCUMENTS

| | | | |
|---|---|---|---|
| 5,503,785 A | 4/1996 | Crump et al. ............... 264/40.7 |
| 5,764,521 A | 6/1998 | Batchelder et al. ...... 364/475.01 |
| 5,943,235 A | 8/1999 | Earl et al. | |
| 6,004,124 A | 12/1999 | Swanson et al. .............. 425/375 |
| 6,021,358 A | 2/2000 | Sachs .............................. 700/98 |
| 6,099,573 A | 8/2000 | Xavier | |
| 6,118,456 A | 9/2000 | Cooper ......................... 345/433 |
| 6,264,873 B1 | 7/2001 | Gigl et al. | |
| 6,407,748 B1 | 6/2002 | Xavier | |
| 6,408,321 B1 | 6/2002 | Platt | |
| 6,532,394 B1 | 3/2003 | Earl et al. | |
| 6,682,684 B1 | 1/2004 | Jamalabad et al. ........... 264/308 |
| 6,828,965 B2 | 12/2004 | Rockwood | |
| 6,907,307 B2 | 6/2005 | Chen et al. .................... 700/119 |

(Continued)

FOREIGN PATENT DOCUMENTS

WO    WO-2009047355 A1    4/2009

OTHER PUBLICATIONS

International Search Report and Written Opinion dated Dec. 21, 2012 from International Application No. PCT/US2012/054421 filed Sep. 10, 2012.

(Continued)

*Primary Examiner* — Charles Kasenge
(74) *Attorney, Agent, or Firm* — Brian R. Morrison; Westman, Champlin & Koehler, P.A.

(57) ABSTRACT

A method for calculating a support material volume, the method comprising generating a grid of cells for a tree data structure of a digital part, where the cells define a plurality of cell arrays, and pinging the cells of one of the cell arrays until a cell containing a subset of the tree data structure is reached or until each cell in the cell array is pinged, where if a cell containing the subset of the tree data structure is reached, then designating the reached cell and all remaining unpinged cells in the cell array as filled. The method also includes repeating the pinging step for each remaining cell array to determine a total filled volume, and subtracting a volume of the digital part from the total filled volume to determine a support material volume.

20 Claims, 22 Drawing Sheets

(56) References Cited

U.S. PATENT DOCUMENTS

| | | | |
|---|---|---|---|
| 6,923,634 B2 | 8/2005 | Swanson et al. | |
| 7,084,870 B2 * | 8/2006 | Fang et al. | 345/420 |
| 7,122,246 B2 | 10/2006 | Comb et al. | 428/364 |
| 7,228,519 B2 | 6/2007 | Aoki et al. | 716/15 |
| 7,305,367 B1 | 12/2007 | Hollis et al. | 705/400 |
| 7,308,328 B2 * | 12/2007 | Fang et al. | 700/98 |
| 7,373,286 B2 * | 5/2008 | Nikolskiy et al. | 703/7 |
| 7,403,833 B2 | 7/2008 | Heide et al. | 700/119 |
| 7,428,481 B2 * | 9/2008 | Nikolskiy et al. | 703/6 |
| 7,500,846 B2 * | 3/2009 | Eshed et al. | 425/375 |
| 7,590,462 B2 * | 9/2009 | Rubbert et al. | 700/98 |
| 7,604,470 B2 | 10/2009 | LaBossiere et al. | 425/131.1 |
| 7,625,200 B2 | 12/2009 | Leavitt | 425/375 |
| 7,747,305 B2 | 6/2010 | Dean et al. | |
| 7,773,087 B2 | 8/2010 | Fowler et al. | |
| 7,810,025 B2 | 10/2010 | Blair et al. | |
| 7,831,328 B2 | 11/2010 | Schillen et al. | |
| 7,840,393 B1 | 11/2010 | Whirley et al. | |
| 7,848,838 B2 | 12/2010 | Gershenfeld et al. | 700/118 |
| 7,891,964 B2 | 2/2011 | Skubic et al. | 425/375 |
| 8,032,337 B2 * | 10/2011 | Deichmann et al. | 703/1 |
| 8,219,234 B2 | 7/2012 | Kritchman et al. | |
| 2003/0227455 A1 | 12/2003 | Lake et al. | 345/421 |
| 2004/0006405 A1 | 1/2004 | Chen et al. | |
| 2004/0095343 A1 | 5/2004 | Forest et al. | 345/419 |
| 2005/0131570 A1 | 6/2005 | Jamalabad et al. | 700/119 |
| 2005/0140678 A1 | 6/2005 | Gielis et al. | 345/441 |
| 2006/0098009 A1 | 5/2006 | Zumiga | 345/421 |
| 2006/0111807 A1 | 5/2006 | Gothait et al. | 700/119 |
| 2006/0155418 A1 | 7/2006 | Bradbury et al. | 700/182 |
| 2008/0079731 A1 | 4/2008 | Shearer | 345/473 |
| 2008/0184185 A1 | 7/2008 | Sailzer et al. | 716/119 |
| 2008/0192044 A1 | 8/2008 | Fowler et al. | 345/419 |
| 2008/0192046 A1 | 8/2008 | Fowler et al. | 345/419 |
| 2008/0192051 A1 | 8/2008 | Fowler et al. | 345/421 |
| 2008/0261165 A1 | 10/2008 | Steingart et al. | 433/24 |
| 2010/0096485 A1 | 4/2010 | Taatjes et al. | |
| 2010/0096489 A1 | 4/2010 | Taatjes et al. | |
| 2010/0190556 A1 | 7/2010 | Chan | 463/43 |
| 2010/0283172 A1 | 11/2010 | Swanson | |
| 2010/0291505 A1 | 11/2010 | Rawley et al. | 433/72 |
| 2011/0076496 A1 | 3/2011 | Batchelder et al. | |
| 2011/0178621 A1 | 7/2011 | Heide | |

OTHER PUBLICATIONS

Huang et al., "Sloping wall structure support generation for fused deposition modeling", Int J Adv Manuf Technol, 2009, pp. 1074-1081.

Huang et al., "Slice Data Based Support Generation Algorithm for Fused Deposition Modeling", Tsinghua Science and Technology, Jun. 2009, vol. 14, pp. 223-228.

* cited by examiner

US 8,818,544 B2

SOLID IDENTIFICATION GRID ENGINE FOR CALCULATING SUPPORT MATERIAL VOLUMES, AND METHODS OF USE

BACKGROUND

The present disclosure relates to additive manufacturing processes for printing three-dimensional (3D) parts and support structures. In particular, the present disclosure relates to processes for calculating support material volumes for use in printing 3D parts and support structures with additive manufacturing techniques.

Additive manufacturing systems are used to print or otherwise build 3D parts from digital representations of the 3D parts (e.g., AMF and STL format files) using one or more additive manufacturing techniques. Examples of commercially available additive manufacturing techniques include extrusion-based techniques, jetting, selective laser sintering, powder/binder jetting, electron-beam melting, and stereolithographic processes. For each of these techniques, the digital representation of the 3D part is initially sliced into multiple horizontal layers. For each sliced layer, a tool path is then generated, which provides instructions for the particular additive manufacturing system to print the given layer.

For example, in an extrusion-based additive manufacturing system, a 3D part may be printed from a digital representation of the 3D part in a layer-by-layer manner by extruding a flowable part material. The part material is extruded through an extrusion tip carried by a print head of the system, and is deposited as a sequence of roads on a substrate in an x-y plane. The extruded part material fuses to previously deposited part material, and solidifies upon a drop in temperature. The position of the print head relative to the substrate is then incremented along a z-axis (perpendicular to the x-y plane), and the process is then repeated to form a 3D part resembling the digital representation.

In fabricating 3D parts by depositing layers of a part material, supporting layers or structures are typically built underneath overhanging portions or in cavities of 3D parts under construction, which are not supported by the part material itself. A support structure may be built utilizing the same deposition techniques by which the part material is deposited. The host computer generates additional geometry acting as a support structure for the overhanging or free-space segments of the 3D part being formed. Support material is then deposited from a second nozzle pursuant to the generated geometry during the printing process. The support material adheres to the part material during fabrication, and is removable from the completed 3D part when the printing process is complete.

SUMMARY

An aspect of the present disclosure is directed to a method for calculating a support material volume with a computer-based system. The method includes providing a tree data structure for a digital part, and generating a grid of cells for the tree data structure with the computer-based system, where the cells define a plurality of cell arrays. The method also includes pinging the cells of one of the cell arrays until a cell containing a subset of the tree data structure is reached or until each cell in the cell array is pinged, where if a cell containing the subset of the tree data structure is reached, then designating the reached cell and all remaining unpinged cells in the cell array as filled. The method further includes repeating the pinging step for each remaining cell array to determine a total filled volume, and subtracting a volume of the digital part from the total filled volume to determine a support material volume.

Another aspect of the present disclosure is directed to a method for manipulating a digital part with a computer-based system for use in an additive manufacturing process. The method includes (a) providing a grid of cells for a tree data structure of a digital part, where the cells are organized in cell arrays along a plurality of directional axes. The method also includes (b) selecting a first directional axis of the plurality of directional axes, (c) for each cell array along the first directional axis, pinging the cells of the cell array until a cell containing a subset of the tree data structure is reached, and (d) designating the reached cell and all remaining unpinged cells in the cell array as filled. The method further includes (d) repeating the steps (c) and (d) for each cell array along the remaining directional axes of the plurality of directional axes to determine a total filled volume for each of the plurality of directional axes, (e) subtracting a volume of the digital part from the total filled volume for each of the plurality of directional axes to determine a support material volume for each of the plurality of directional axes, and (h) identifying the directional axis having the lowest determined support material volume.

Another aspect of the present disclosure is directed to a price quoting method for use in an additive manufacturing process. The price quoting method includes providing a tree data structure for a digital part to be printed with the additive manufacturing process, and generating a grid of cells for the tree data structure with a computer-based system, where the cells of the grid define a plurality of cell arrays. For each cell array, the method also includes pinging the cells with the computer-based system until a cell containing a subset of the tree data structure is reached or until an end cell of the cell array is pinged. The method further includes designating all pinged cells containing subsets of the tree data structure and all unpinged cells as filled with the computer-based system, summing volumes of the designated filled cells with the computer-based system to provide a total filled volume, subtracting a volume of the digital part from the total filled volume with the computer-based system to determine a support material volume, and generating a price quote based at least in part on the determined support material volume.

BRIEF DESCRIPTION OF THE DRAWINGS

FIG. 7D illustrates an alternative process when supporting lateral surfaces of a 3D part.

DETAILED DESCRIPTION

The present disclosure is directed to a computer-implemented program, referred to as a Solid Identification Grid (SIG) engine, that quickly calculates the volume of support material needed to print or otherwise build a 3D part using an additive manufacturing system. The following discussion of the SIG engine is made in conjunction with a price quoting program that allows a user to request an online price quote for printing a 3D part. For instance, a developer may create a digital part (i.e., a digital representation of a 3D part) that he or she wishes to have printed as a physical 3D part by a manufacturer, such as by the on-demand service unit "RED-EYE" of Stratasys, Inc., Eden Prairie, Minn. To accomplish this, the developer may access the manufacturer's price quoting program, which analyzes the developer's digital part and sends back a price quote for printing the physical 3D part.

The price quote is based on numerous factors, including the volumes of part and support materials required to print the 3D part. The required volume of part material is typically available based on the volume and geometry of the analyzed digital part. As such, the price quoting program can quickly determine the required part material volume, and its related cost.

The volume of support material, however, is more difficult to establish because the analyzed digital part does not include the support structure. Rather, layers of the support structure are typically generated at a later point in the process, during which the digital part is sliced into horizontal layers and tool paths are generated. As such, during the price quoting step, it is difficult to quickly establish the volume of support material needed to print the 3D part, and hence, its related cost.

The SIG engine of the present disclosure, however, is suitable for quickly calculating support material volumes need to print 3D parts. As discussed below, the SIG engine utilizes a collision detection technique to identify the geometry of a digital part. Based on the identified geometry, and the known volume of the digital part, the SIG engine can quickly calculate the volume of support material that will be necessary to print a support structure in coordination with the 3D part. Thus, the SIG engine is particularly suitable in combination with a price quoting program to provide instant price quotes. However, as discussed below, the SIG engine may also be used in conjunction with a variety of additional processes, such as tool-path generation processes, run-time and scheduling determinations, and the like.

Figure 1:
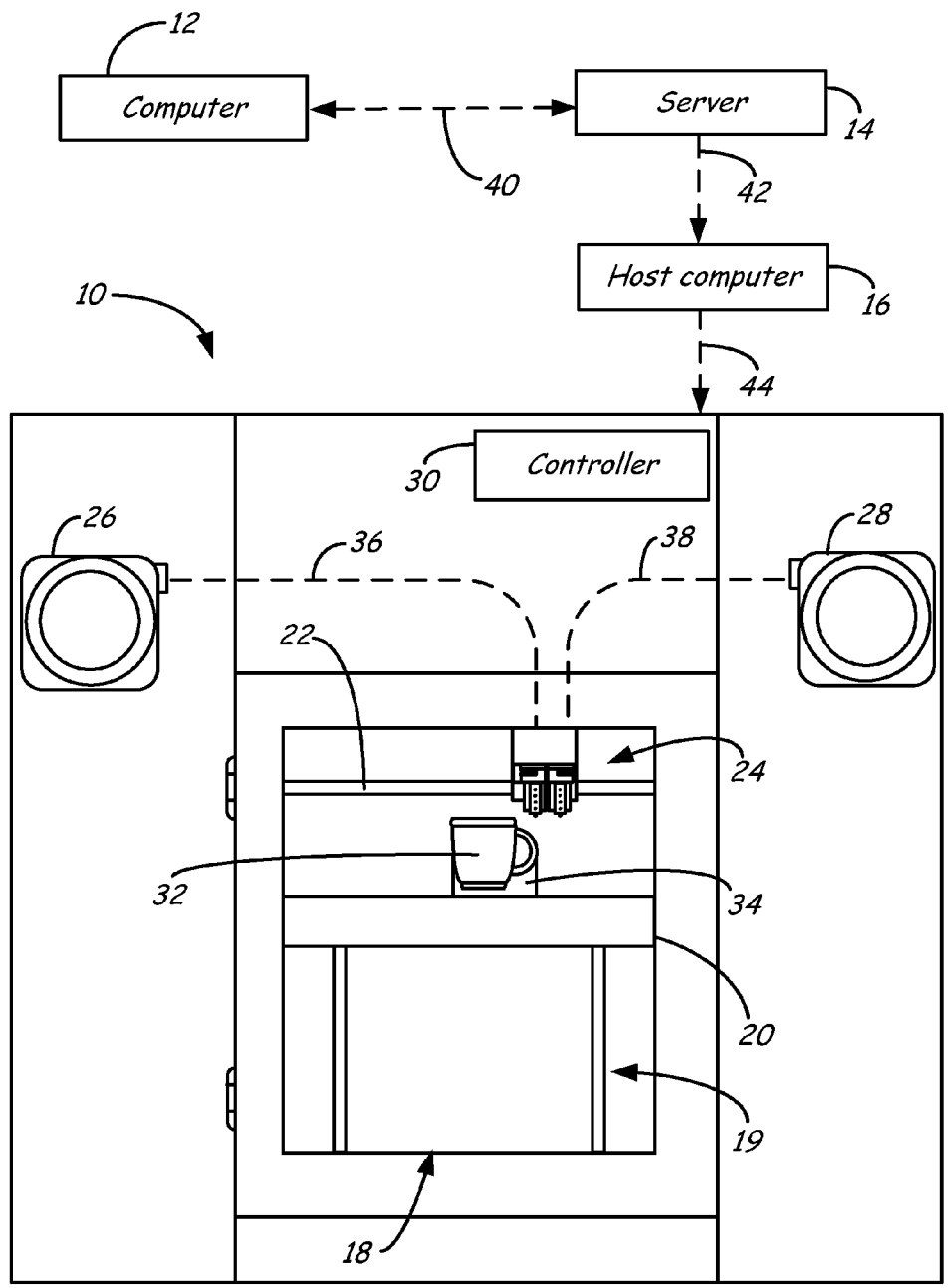
FIG. 1 is a front schematic illustration of an additive manufacturing system in use with computer-based systems for printing 3D parts and support structures.

FIG. 1 illustrates system 10 in use with computer 12, server 14, and host computer 16, which depicts a suitable arrangement for implementing the SIG engine of the present disclosure in conjunction with a price quoting program. System 10 is an additive manufacturing system for printing or otherwise building 3D parts and support structures in a layer-by-layer manner.

Examples of suitable systems for system 10 include extrusion-based additive manufacturing systems, such as those commercially available by Stratasys, Inc., Eden Prairie, Minn. under the trademarks "FUSED DEPOSITION MODELING" and "FDM". In alternative embodiments, system 10 may be any suitable additive manufacturing system that prints or otherwise builds 3D parts in a layer-by-layer manner, and that relies on one or more materials to support overhanging and/or lateral surfaces of the 3D parts, such as jetting systems, selective laser sintering systems, powder/binder jetting systems, electron-beam melting systems, stereolithography systems, and the like.

System 10 includes build chamber 18, z-axis gantry 19, platen 20, x-y-axis gantry 22, print head 24, and supply sources 26 and 28. System 10 also includes controller 30, which is one or more processor-based controllers configured to control the operation of the components of system 10.

Build chamber 18 is an enclosable environment that contains platen 20 for printing a 3D part or model (referred to as 3D part 32) and a corresponding support structure (referred to as support structure 34) with part and support materials (e.g., thermoplastic materials). Build chamber 18 is desirably heated to reduce the rate at which the part and support materials solidify after being extruded and deposited (e.g., to reduce distortions and curling). In alternative embodiments, build chamber 18 may be omitted and/or replaced with different types of build environments. For example, 3D part 32 and support structure 34 may be printed in a build environment that is open to ambient conditions or may be enclosed with alternative structures (e.g., flexible curtains). The build environment may also be heatable in a variety of manners (e.g., with heated circulating air, heat lamps, and the like).

Z-axis gantry 19 is a vertical gantry assembly configured to move platen 20 along the vertical z-axis based on instructions provided from controller 30. Platen 20 is a platform on which 3D part 32 and support structure 34 are printed in a layer-by-layer manner.

X-y-axis gantry 22 is a guide rail assembly that is configured to move print head 24 in a horizontal x-y plane based on instructions provided from controller 30. The horizontal x-y plane is a plane defined by an x-axis and a y-axis (not shown in FIG. 1), where the x-axis, the y-axis, and the z-axis are orthogonal to each other in a Cartesian coordinate system. In an alternative embodiment, platen 20 may be configured to move in the horizontal x-y plane within build chamber 18, and print head 24 may be configured to move along the z-axis. Other similar arrangements may also be used such that one or both of platen 20 and print head 24 are moveable relative to each other. Furthermore, system 10 may be configured to print 3D part 32 and support structure 34 using different coordinate systems (e.g., a polar coordinate system, an oblique coordinate system, and the like).

Print head 24 is supported by x-y-axis gantry 22 for printing 3D part 32 and support structure 34 on platen 20 in a layer-by-layer manner, based on instructions provided from controller 30. In the embodiment shown in FIG. 1, print head 24 is a dual-tip extrusion head configured to deposit part and support materials from supply source 26 and supply source 28, respectively.

Examples of suitable extrusion heads for print head 24 include those disclosed in Crump et al., U.S. Pat. No. 5,503,785; Swanson et al., U.S. Pat. No. 6,004,124; LaBossiere, et al., U.S. Pat. No. 7,604,470; Leavitt, U.S. Pat. No. 7,625,200; and U.S. patent application Ser. No. 12/976,111, entitled "Print Head Assembly For Use In Fused Deposition Modeling Systems". In alternative embodiments, print head 24 may function as a multiple-stage screw pump, as disclosed in Batchelder et al., U.S. Pat. No. 5,764,521; and Skubic et al., U.S. Pat. No. 7,891,964. Furthermore, system 10 may include a plurality of print heads 24 for depositing part and/or support materials from one or more tips.

The part material is supplied to print head 24 from supply source 26 via feed line 36, thereby allowing print head 24 to deposit the part material to print 3D part 32. Correspondingly, the support material is supplied to print head 24 from supply source 28 via feed line 38, thereby allowing print head 24 to deposit the support material to print support structure 34.

The part and support materials may be provided to system 10 in a variety of different media. Commonly, the materials may be supplied in the forms of continuous filaments. For example, in system 10, the part and support materials may be provided as continuous filament strands fed respectively from supply sources 26 and 28, as disclosed in Swanson et al., U.S. Pat. No. 6,923,634; Comb et al., U.S. Pat. No. 7,122,246; Taatjes et al, U.S. Patent Application Publication Nos. 2010/0096485 and 2010/0096489; and Swanson et al., U.S. Patent Application Publication No. 2010/0283172. Examples of suitable average diameters for the filament strands of the modeling and support materials range from about 1.27 millimeters (about 0.050 inches) to about 3.0 millimeters (about 0.120 inches).

Alternatively, the part and support materials may exhibit non-cylindrical filament geometries, such as rectangular geometries. Examples of suitable dimensions for the exhibit non-cylindrical filament geometries include those disclosed in Batchelder et al., U.S. Patent Application Publication No. 2011,0076496. In further alternative embodiments, the part and support materials may be provided as other forms of media (e.g., pellets, slugs, and resins) from other types of storage and delivery components (e.g., supply hoppers and vessels).

During a printing operation, print head 24 deposits the received part and support materials onto platen 20 to print 3D part 32 and support structure 34 in a layer-by-layer manner based on instructions from controller 30. Support structure 34 is desirably deposited to provide vertical support along the z-axis for overhanging regions of the layers of 3D part 32, and, optionally, to provide lateral support to various surfaces of 3D part 32. The use of support structure 34 thereby allows 3D part 32 to be built with a variety of geometries.

After the printing operation is complete, the resulting 3D part 32/support structure 34 may be removed from build chamber 18. Support structure 34 may then be removed from 3D part 32, and 3D part 32 may undergo one or more post-printing operations (e.g., vapor smoothing and media blasting).

As can be appreciated, support structures (e.g., support structure 34) are necessary to support overhanging portions and/or lateral surfaces of 3D parts (e.g., 3D part 32) during the printing operation, which are not supported by the part material itself. Thus, the cost to print 3D part 32 is dependent on the volume of support material needed to print support structure 34 in a manner that sufficiently supports the layers of 3D part 32. As a result, a price quoting program implemented by computer 12 and/or server 14 needs to account for this required support material volume when generating price quotes.

Computer 12, server 14, and host computer 16 are each one or more computer-based systems configured to communicate with each other and/or system 10. Computer 12 may be any suitable computer-based system (e.g., a personal computer, laptop computer, server-based system, mobile device, computer tablet device, and the like), and is configured to communicate with server 14 over one or more network communication lines (referred to collectively as network line 40).

Server 14 may be managed by a manufacturer that operates system 10, and is configured to run a price quoting program that is accessible by multiple computers over network line 40. For example, a user of computer 12 may communicate with server 14 over network line 40 to generate online price quotes for printing 3D parts, such as 3D part 32. Server 14 is also configured to communicate with host computer 16 over one or more communication lines (referred to collectively as communication line 42). Host computer 16 may also be managed by the manufacturer that operates system 10, and is configured to communicate with system 10 over one or more communication lines (referred to collectively as communication line 44) for printing 3D parts and support structures (e.g., 3D part 32 and support structure 34).

Figure 2A:
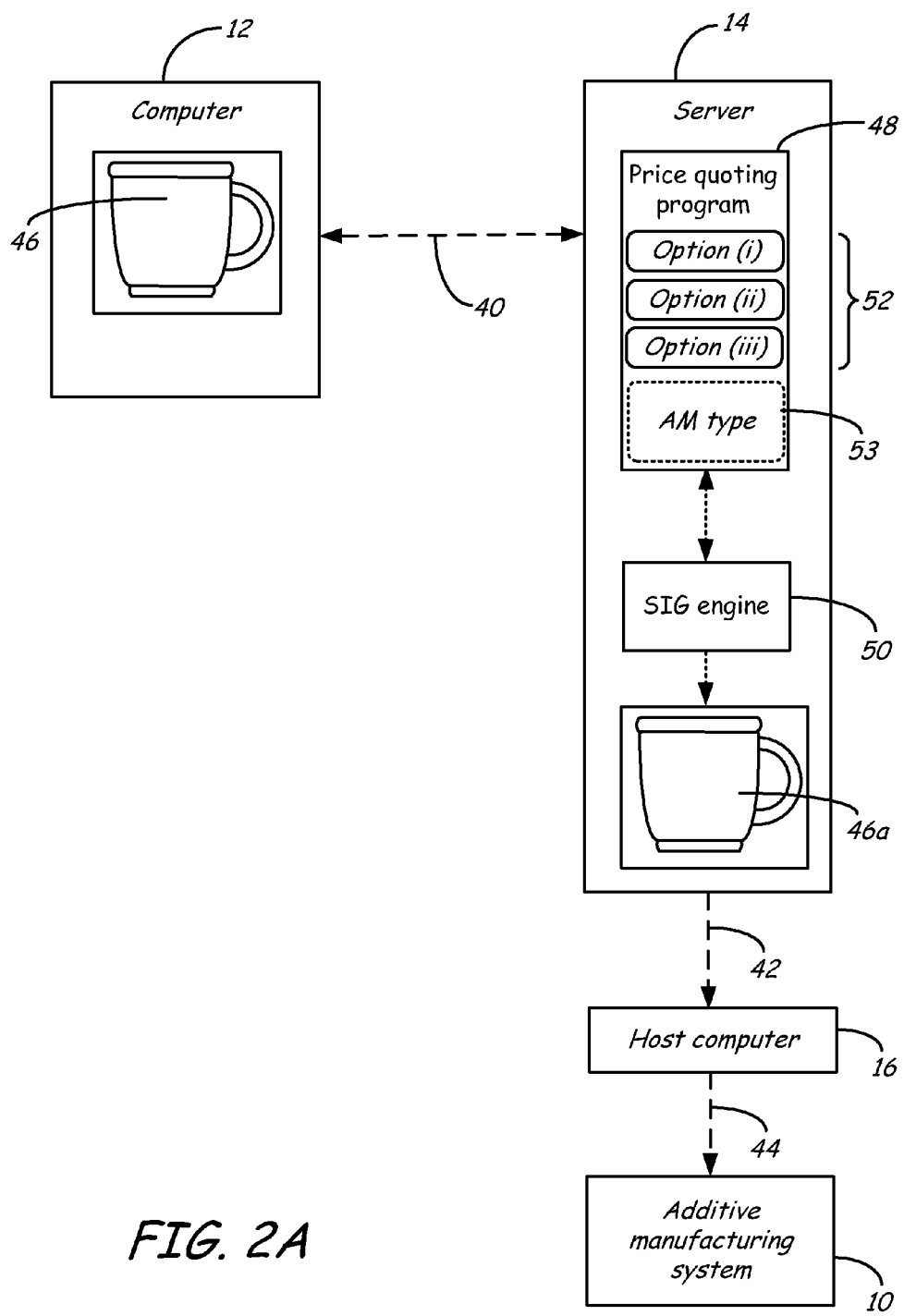
FIG. 2A is a schematic illustration of the computer-based systems, illustrating a first embodiment in which a Solid Identification Grid engine of the present disclosure is retained on a server.

As shown in FIG. 2A, prior to the printing operation, a user may retain a digital representation (e.g., an AMF or STL format file) of 3D part 32, referred to as digital part 46, on one or more data storage devices of computer 12. The manufacturer may correspondingly retain price quoting program 48 and SIG engine 50 on one or more data storage devices of server 14. Price quoting program 48 is a computer-implement program accessible over the Internet that generates price quotes for printing 3D parts with system 10 or other additive manufacturing systems. SIG engine 50 is the computer-implemented program of the present disclosure, which calculates the volumes of support material that are needed to print the 3D parts, as discussed below, and operates in conjunction with price quoting program 48.

To request a price quote for printing 3D part 32 based on digital part 46, the user of computer 12 may access price quoting program 48 over network line 40. In the shown embodiment, the user of computer 12 also sends a copy of digital part 46 and any related specifications (e.g., part materials, dimensions, user-selected options, and the like) over network line 40 to server 14.

The volume of support material needed to print 3D part 32 depends on the orientation of digital part 46 in the x-y-z coordinate system (or other coordinate system). As such, price quoting program 48 may include menu 52 of user-selectable options, where the user-selectable options can affect the orientation of digital part 46 during the printing operation. For example, menu 52 may include options such as (i) optimizing the price quote by orienting digital part 46 in a manner that minimizes the required volume of support material, (ii) preserving the orientation of digital part 46, and (iii) orienting digital part 46 to minimize the z-axis height of 3D part 32. In some embodiments, menu 52 (or other interface) may also include additional user-selectable options.

These user-selectable options may then be exported to SIG engine 50 when calculating the required support material volume. For example, option (i) allows SIG engine 50 to orient digital part 46 in any manner needed to minimize the amount of support material required to print 3D part 32. As such, under option (i), SIG engine 50 can calculate the needed support material volume along multiple directional axes of digital part 46 to attain the directional axis that provides the lowest amount of required support material.

In comparison, options (ii) and (iii) limit the extent that digital part 46 can be reoriented from its initial orientation. As such, these two options may not necessary result in the lowest amount of support material, and consequentially, the lowest price quote. However, in many situations, users may prefer the 3D parts to be printed in particular orientations regardless of the cost effects, such as to preserve the strengths and/or aesthetic qualities of the 3D parts along particular surfaces.

Furthermore, price quoting program 48 may include menu 53, which allows the user to select which additive manufacturing process to use to print or otherwise build 3D part 32. As discussed below, the various types of additive manufacturing processes may require different volumes of support material to print or otherwise build 3D parts. For example, extrusion-based additive manufacturing systems typically only require a support material to be placed below the part materials layers. In comparison, however, some jetting systems require support materials to also be used to support lateral surfaces of the 3D parts. Moreover, some powder-based additive manufacturing systems may recycle portions of the non-bound powders, thereby reducing the overall consumed volume of the support material. Accordingly, SIG engine 50 may be configured to calculate the support material volumes differently depending on the additive manufacturing process selected with menu 53.

Upon receipt of digital part 46, SIG engine 50 may extract information from price quoting program 48 (e.g., the user-selected options from menus 52 and 53), and may analyze the received digital part 46 to calculate the volume of support material required to print 3D part 32, as discussed below. SIG engine 50 may then output the calculated support material volume to price quoting program 48, allowing price quoting program 48 to generate a price quote for printing 3D part 32 with system 10. SIG engine 50 may also export a new digital part (referred to as new digital part 46a) to server 14, where the new digital part 46a is the reoriented digital part 46. Server 14 may then send the generated price quote and the new digital part 46a back to computer 12 over network line 40.

If the user accepts the price quote, server 14 may then send the new digital part 46a to host computer 16 over communication line 42. Host computer 16 may then slice digital part 46a into multiple horizontal layers, and generate digital support layers for support structure 34. Host computer 16 may also generate tool-path instructions and other related information for each layer of digital part 46a and the digital support layers, and the resulting data may be transmitted to system 10 over communication line 44. System 10 may then print 3D part 32 and support structure 34 based on the received data, where the volume of support material consumed to print support structure 34 corresponds to the volume of support material calculated by SIG engine 50.

Figure 2B:
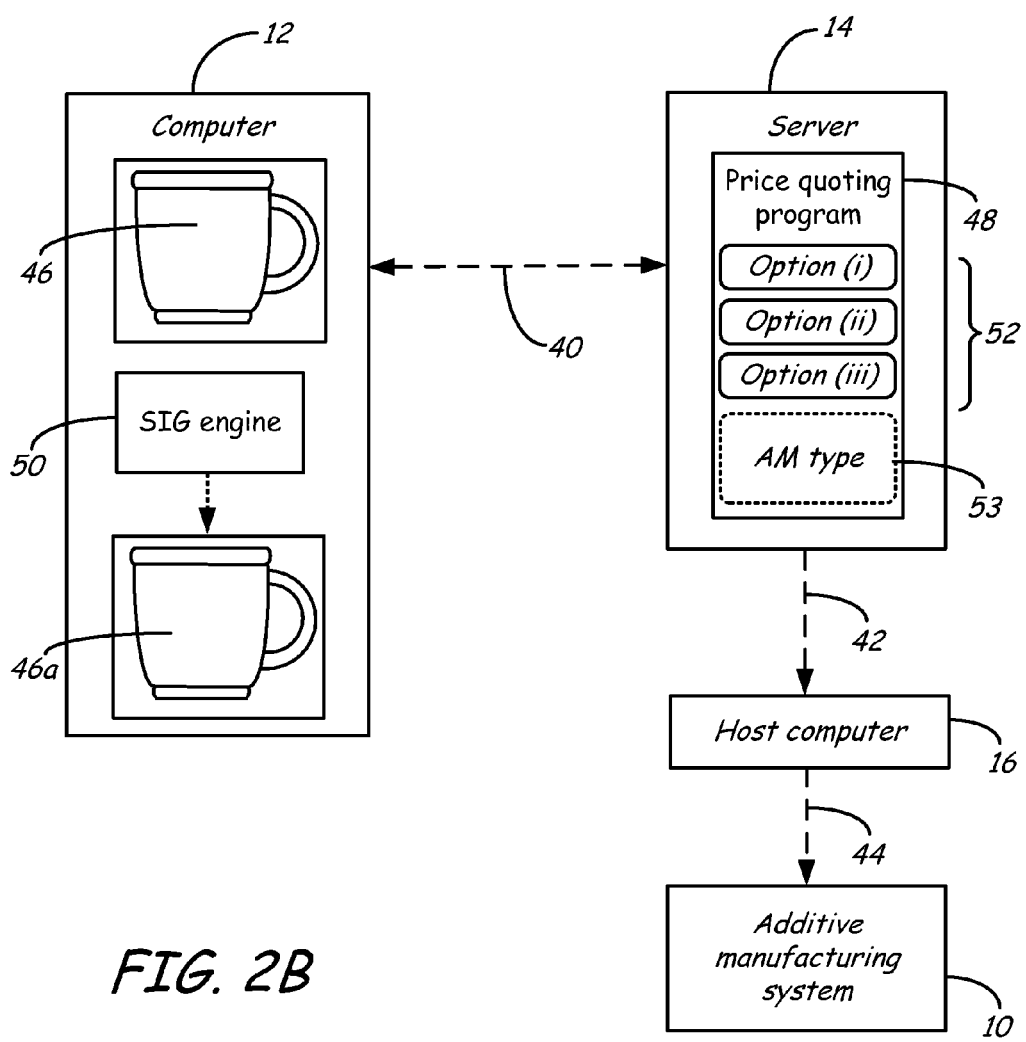
FIG. 2B is a schematic illustration of the computer-based systems, illustrating a second embodiment in which a Solid Identification Grid engine of the present disclosure is retained on a remote computer.

FIG. 2B illustrates an alternative embodiment in which SIG engine 50 is retained on computer 12. In this example, the user of computer 12 may install or otherwise copy an executable file of SIG engine 50 from server 14 (e.g., as a plug-in, widget, application, or the like). To request a price quote for printing 3D part 32 based on digital part 46, the user of remote computer 14 may access price quoting program 48 over network line 40. However, in this embodiment, digital part 46 is not immediately transmitted to server 14.

Instead, SIG engine 50 analyzes digital part 46 on computer 12 to calculate the volume of support material required to print 3D part 32. SIG engine 50 may then output the calculated support material volume to price quoting program 48 on server 14 over network line 40. SIG engine 50 may also export the new digital part 46a to computer 12. Upon receipt of the calculated support material volume, price quoting program 48 may generate a price quote for printing 3D part 32 from digital part 46a. Server 14 then sends the generated price quote back to computer 12 over network line 40.

Retaining SIG engine 50 on computer 12 provides several advantages over having it retained on server 14. First, digital part 46 is not required to be transmitted to sever 14 to attain price quotes, which can speed up the price quoting operation by eliminating this transfer step. Additionally, leaving digital part 46 on computer 12 during the price quote operation also allows the user of computer 12 to check price quotes on digital part 46 without apprehension of having a copy of digital part 46 being saved at a separate location outside of his or her control until he or she accepts the price quote.

If the user accepts the price quote sent from server 14, a copy of digital part 46a and any specifications are then transmitted over network line 40 to server 14. Server 14 may then send the copy of digital part 46a to host computer 16 over communication line 42. Host computer 16 and system 10 may then be used to print 3D part 32 and support structure 34, as discussed above.

The embodiments shown in FIGS. 2A and 2B illustrate suitable architectures for performing price quote operations with the use of SIG engine 50. In a further suitable embodiment, price quote engine 48 may also function as a downloadable program that resides on computer 12, and communicates with server 14 over network line 40.

Figure 3:
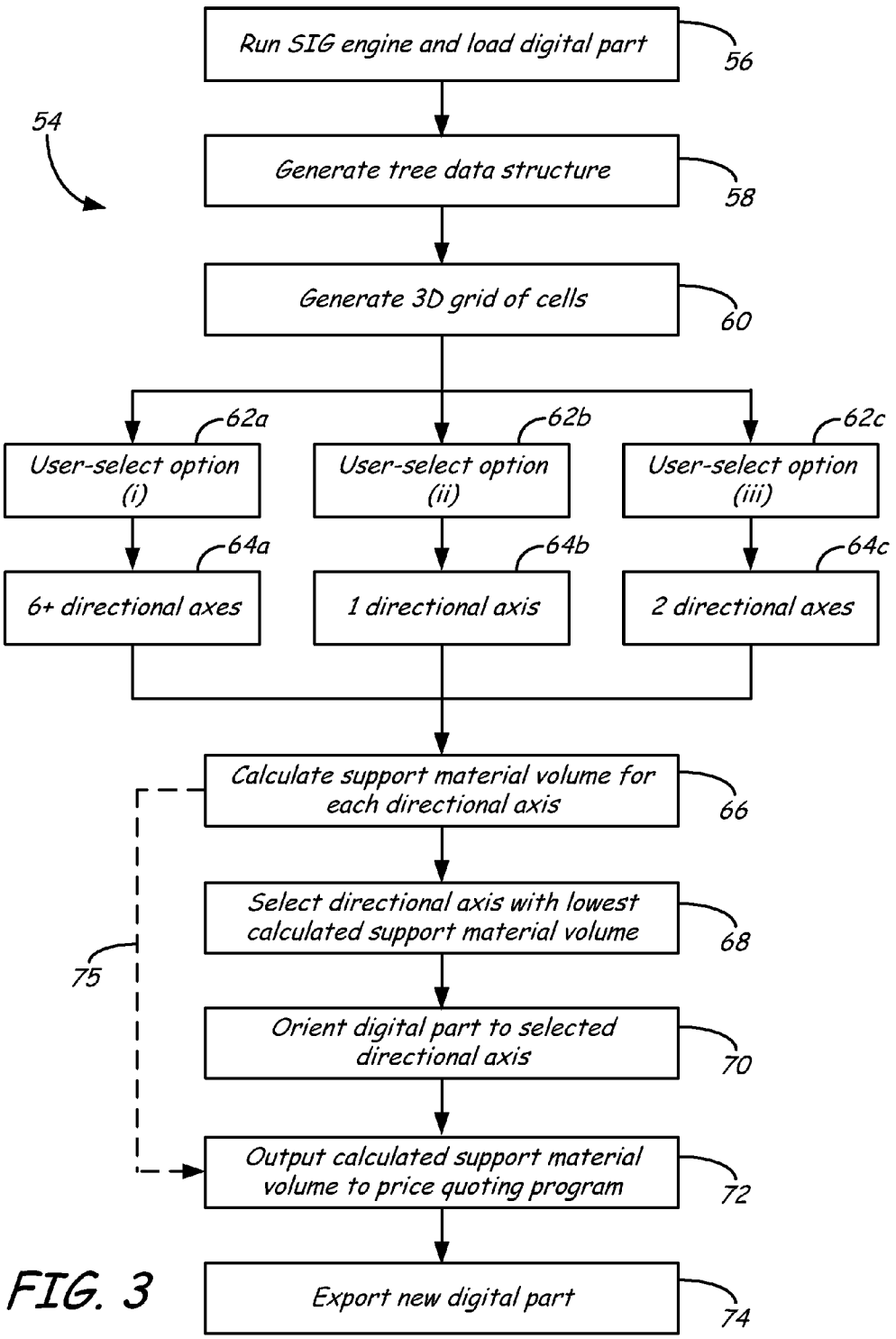
FIG. 3 is a flow diagram of a method for using the Solid Identification Grid engine.

FIG. 3 illustrates a suitable method (referred to as method 54) for implementing SIG engine 50 with a computer-based system (e.g., computer 12 and/or server 14). The following discussion of method 54 is made with reference to system 10, computer 12, 3D part 32, support structure 34, and digital part 46. However, the operation of SIG engine 50 pursuant to method 54 may be used with a variety of additive manufacturing systems and computer-based systems in combination with 3D parts and support structures having numerous different geometries. An application of method 54 to analyze digital part 46 is also illustrated below in FIGS. 5-15.

As shown in FIG. 3, method 54 includes steps 56-74, and initially involves running or otherwise loading SIG engine 50 to the memory of computer 12 (step 56). Computer 12 may also load digital part 46 and/or information related to digital part 46, such as x-y-z coordinate locations, surface area, triangle complexity, solid volume, the user-selected options from menus 52 and 53, and the like. Computer 12 may also perform one or more error-check operations to check digital part 46 for errors. If errors are found, computer 12 may attempt to correct the errors and/or stop the operation of SIG engine 50 and inform the user of the errors.

After digital part 46 is loaded, computer 12 generates a tree data structure for digital part 46 by partitioning the geometry of digital part 46 into multiple subsets (step 58). Examples of suitable tree data structures for use with SIG engine 50 include binary space partitioning (BSP) trees, octrees, and the like. For instance, with a BSP tree, computer 12 may recursively partition digital part 46 into convex subsets until each subset becomes simple enough to be individually pinged by computer 12 using a collision detection technique.

Computer 12 may then generate a 3D grid of cells defining a volume bounding box for the tree data structure of digital part 46 (step 60), where the cells of the 3D grid desirably correspond in size to the subsets of the tree data structure. As discussed below, this allows computer 12 to quickly ping each cell of the 3D grid to determine whether a portion of the tree data structure for digital part 46 resides in a given cell. It is noted that computer 12 does not actually generate a physical or graphical 3D grid of cells (unless desired). Rather, as discussed below, the cells are volumetric increments of coordinate locations retained in the memory of computer 12 for subsequent analysis of the tree data structure for digital part 46.

In steps 62a-62c, computer 12 refers to which option the user selected with menu 52. If the user selected option (i) to optimize the price quote by orienting digital part 46 in any manner to minimize the required volume of support material (step 62a), SIG engine 50 may be configured to calculate the support material volume over six or more directional axes (step 64a). For example, SIG engine 50 may be configured to calculate the support material volume for each primary or major directional axis in the x-y-z coordinate system (i.e., positive and negative directions along the major x-y-z axes), providing six separate calculations. The number of directional axes may also differ depending on the particular coordinate system used, such as for a polar coordinate system or an oblique coordinate system.

Alternatively, if the user selected option (ii) to preserve the orientation of digital part 46 (step 62b), SIG engine 50 may be configured to calculate the support material volume along single directional axis, which is the positive direction along the vertical z-axis for the received orientation of digital part 46 (step 64b). On the other hand, if the user selected option (iii) to orient digital part 46 to minimize the z-axis height of 3D part 32 (step 62c), SIG engine 50 may be configured to calculate the support material volume along two directional axes (step 64c). In this situation, SIG engine 50 may identify an orientation of digital part 46 that minimizes the height of digital part 46. The two directional axes are then the positive and negative vertical directions along the given orientation.

After determining the number of directional axes to analyze, computer 12 then uses SIG engine 50 to calculate the support material volume required to print 3D part 32 from digital part 46 for each directional axis, as discussed below (step 66). Computer 12 then selects the directional axis that corresponds to the lowest calculated support material volume (step 68), and may orient digital part 46 such that the selected axis becomes a positive direction along the vertical z-axis (i.e., an upward facing direction) (step 70). This provides the proper orientation of digital part 46 (and 3D part 32) to print support structure 34 with the minimum amount of support material. In one embodiment, if option (ii) was selected, in which the orientation of digital part 46 is preserved (step 62c), steps 68 and 70 of method 54 may be omitted, as illustrated by broken line 75.

Computer 12 may then output the calculated support material volume to price quote engine 48 (step 72), allowing price quote engine 48 to generate a price quote based in part on the calculated support material volume. Computer 12 may also export a new digital part 46a (e.g., an AMF or STL format file) from the oriented digital part 46 (step 74). As also discussed above, this new digital part 46a may then be transmitted to host computer 16 for use in printing 3D part 32 with system 10.

Figure 4:
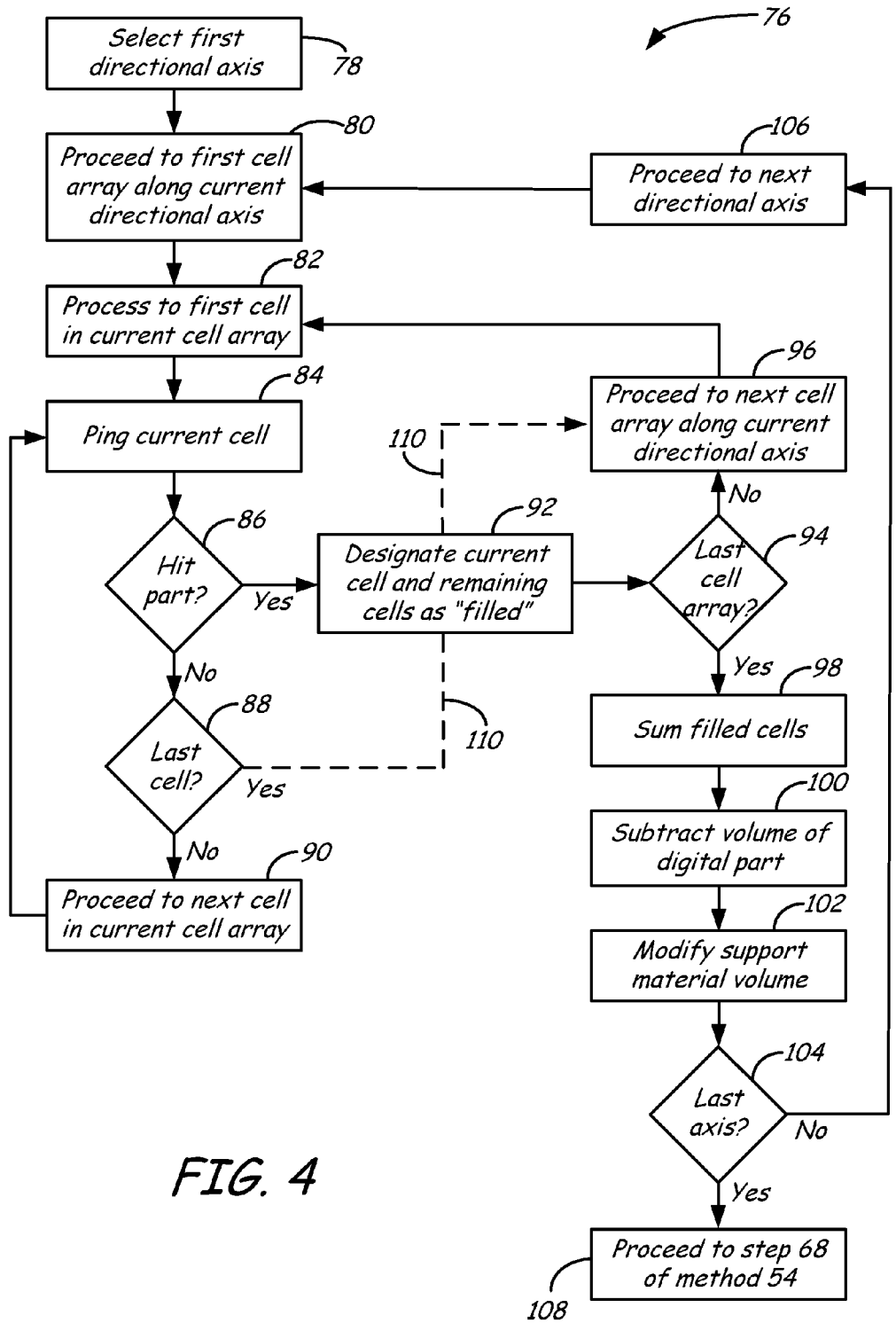
FIG. 4 is a flow diagram of a method of calculating a support material volume using the Solid Identification Grid engine.

FIG. 4 illustrates method 76, which is an example of a suitable method for calculating the support material volume required to print 3D part 32 from digital part 46, pursuant to step 66 of method 54 (shown in FIG. 3). An application of method 76 to analyze digital part 46 is also illustrated below in FIGS. 5-15.

As shown in FIG. 4, method 76 includes steps 78-108, and initially involves selecting a first directional axis along which digital part 46 is oriented to perform the calculation (step 78). Under user-selected options (i) and (ii), the first directional axis may be the positive direction along the vertical z-axis (i.e., the upward facing direction) for the received digital part 46. Alternatively, under user-selected option (iii), the first directional axis may be the positive direction along an axis that minimizes the build height of digital part 46. It is noted that digital part 46 does not actually need to be reoriented during step 78, which can consume processing power of computer 12. Rather, computer 12 recognizes the directional axes in the coordinate system relative to digital part 46. In other words, computer 12 may switch which direction is the upward vertical direction for digital part 46 while performing method 76.

As discussed above, pursuant to step 60 of method 54 (shown in FIG. 3), computer 12 previously generated a 3D grid of cells for digital part 46. For the first directional axis, the cells of the 3D grid are arranged in multiple cell arrays, where each array of cells extends along the first directional axis. This is illustrated below, for example, in FIGS. 6 and 7A-7D.

Computer 12 identifies and proceeds to a first cell array of the multiple cell arrays along the first directional axis (step 80), and identifies and proceeds to a first cell in the first cell array (step 82). Computer 12 then pings the current cell using a collision detection technique to determine if a portion of the tree data structure for digital part 46 resides in the current cell (step 84). In particular, computer 12 may execute a collision detection query against the tree data structure (e.g., BSP tree) of digital part 46 to determine whether a subset of the tree data structure of digital part 46 resides in the current cell. As used herein, the terms "ping", "pinging", and the like, with reference to a cell, refer to the execution of a collision detection query against the tree data structure of a digital part to determine whether a subset of the tree data structure resides in the cell.

In one embodiment, to reduce processing requirements on computer 12, the pinging of each cell under step 84 may be performed at a central coordinate point of the given cell. As mentioned above, the cells of the 3D grid are volumetric increments of x-y-z locations, rather than physical or graphical cells. In this embodiment, the x-y-z locations are located at the central coordinate points of the volumetric increments (i.e., at the volumetric centers of the cells). As such, pursuant to step 84 of method 76, computer 12 may execute the collision detection query against the central coordinate point in the current cell to determine whether a subset of the tree data structure for digital part 46 resides in the current cell. In alternative embodiments, the pinging in each cell under step 84 may be performed at any suitable coordinate location within the volume of the given cell.

While this embodiment may result in small numbers of false-positive results and false-negative results since the pinging is performed at particular x-y-z coordinates (rather than over full volumetric increments), the small volumes of each of the cells render such results minor or negligible. Moreover, this embodiment can substantially reduce the processing requirements on computer 12, allowing SIG engine 50 to quickly perform the steps of method 76 and rapidly return calculated support material volumes to price quoting program 48.

At step 86 of method 76, if the pinging does not hit a portion of digital part 46 (i.e., hit a subset of the tree data structure for digital part 46) in the current cell, computer 12 then checks whether the current cell is the last cell in the current cell array (step 88). If not, computer 12 proceeds to the next successive cell in the current cell array (step 90) and repeat steps 84, 86, 88, and 90 until a portion of digital part 46 residing in a given cell along the current cell array is reached (step 86), or until each cell in the current cell array is pinged (step 88).

If a portion of digital part 46 is hit in a cell during one of the pinging steps, computer 12 then designates the current cell (i.e., the cell in which the portion of digital part 46 is hit) and all remaining subsequent and unpinged cells in the current cell array as being "filled" (step 92). This step distinguishes the cells that do not contain any part or support materials (non-filled cells), and the cells that contain part or support materials (filled cells). This step also stops all subsequent pingings for the current cell array, thereby reducing the processing requirements of computer 12.

After the given cell(s) of the current cell array are designated as "filled", computer 12 checks whether the current cell array is the last cell array of the 3D grid along the current directional axis (step 94). If not, computer 12 proceeds to the next cell array along the current directional axis (step 96), and repeat steps 82-96 for each of the remaining cell arrays of the 3D grid along the current directional axis.

Alternatively, pursuant to step 88, if the last cell in the current cell array is pinged and no hits are made during the pinging steps (i.e., the tree data structure for digital part 46 does not reside in any of the cells of the current cell array), computer 12 proceeds to the next cell array along the current directional axis (step 96, as illustrated by a broken line 110 that does not intersect step 92), and repeat steps 82-86 for each of the remaining cell arrays of the 3D grid along the current directional axis.

After the last cell array of the 3D grid along the current directional axis is analyzed (step 94), computer 12 then sums the volumes of all of the cells previously designated as filled (step 98). This provides the total filled volume for digital part 46 and the digital support layers. In an alternative embodiment, the summing operation in step 98 may be performed for each cell array during or after designation step 92, in a cumulative manner. The resulting summed total filled volume will be the same in either embodiment.

After the summed total filled volume is obtained, the volume of digital part 46 may then be subtracted from the summed total filled volume to provide an initial volume of support material needed to print 3D part 32 with system 10 (step 100). Alternatively, this subtracting step may also be performed for each cell array during or after designation step 92, where the summed filled volume for each cell array may be reduce or otherwise offset by the volume of digital part 46 along the given cell array.

In the shown example, support structure 34 (shown in FIG. 1) is illustrated with a dense fill, and extends vertically downward from all overhanging surfaces of 3D part 32. In this situation, the initial volume of support material generated in step 100 of method 76 provides an accurate representation of the amount of support material needed to print 3D part 32. However, the initial support material volume attained from step 100 may be modified (step 102) to accommodate variations in printing styles, such as column support structures, sparse-fill support structures, and the like. In one embodiment, the initial support material volume attained from step 100 may be reduced based on the algorithm disclosed in Heide, U.S. Patent Application Publication No. 2011/0178621, which may generate the digital support layers having convex outer dimensions that reduce in size and complexity in a downward direction along the vertical z-axis.

After the support material volume for digital part 46 is calculated along the first directional axis, computer 12 may then check whether the current directional axis is the last directional axis to analyze (step 104). Under user-selected option (i), SIG engine 50 is set up to analyze digital part 46 along six or more directional axes (from steps 62a and 64a of method 54). Similarly, under user-selected option (iii), SIG engine 50 is set up to analyze digital part 46 along two directional axes (from steps 62c and 64c of method 54). In these situations, computer 12 proceeds to the next directional axis (step 106) and repeat steps 80-106 for each remaining directional axis.

As mentioned above, when proceeding to each successive directional axis, computer 12 desirably does not reorient digital part 46, which can take up valuable processing power. Instead, computer 12 merely designates the selected directional axis as the new "upward" direction and repeats steps 80-106 for each new upward direction.

After the support material volume for digital part 46 is calculated along each directional axis (step 106), computer 12 then proceeds to step 68 of method 54 (shown in FIG. 3) (step 108). As such, as mentioned above, computer 12 may then select the directional axis that corresponds to the lowest calculated support material volume (step 68 of method 54), may orient digital part 46 such that the selected axis becomes a positive direction along the vertical z-axis (i.e., an upward facing direction) (step 70 of method 54), may output the calculated support material volume to price quoting program 48 (step 72 of method 54), and may export new digital part 46a (step 74 of method 54).

Alternatively, under user-selected option (ii), SIG engine 50 is configured to analyze digital part 46 only along a single directional axis (from steps 62b and 64b of method 54). In this case, after steps 100 and 102 of method 76 are performed for the first and only directional axis, computer 12 may then proceed directly to step 68 of method 54 (step 108), or alternatively, directly to step 72 of method 54 (as illustrated by broken line 75 in FIG. 3). In this case, may output the calculated support material volume to price quoting program 48 (step 72 of method 54), and, optionally, export new digital part 46a (step 74 of method 54).

Figure 5:
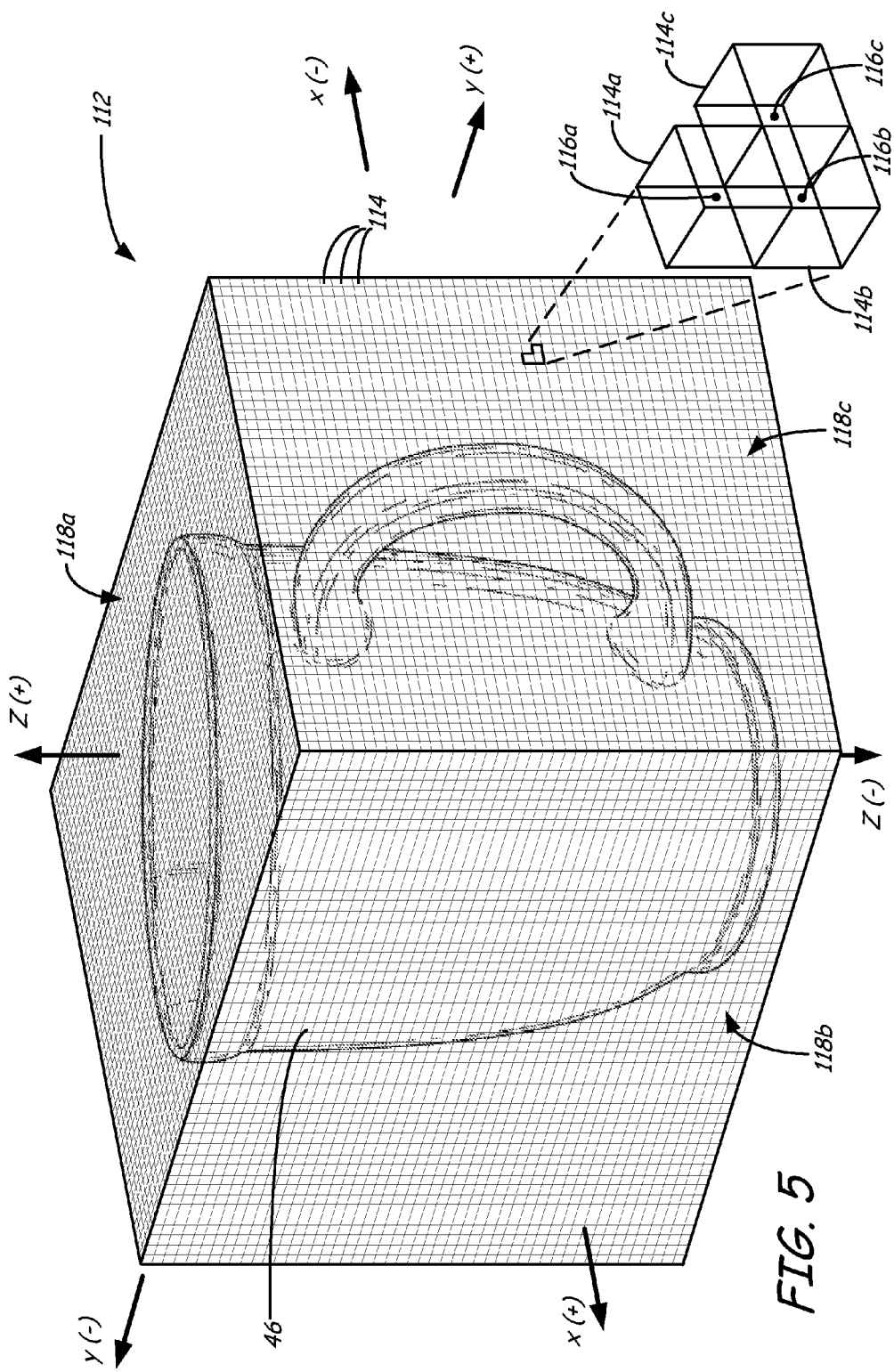
FIG. 5 is a perspective view of a generated grid of cells using the Solid Identification Grid engine.

FIGS. 5-15 illustrate an application of method 54 (shown in FIG. 3) and method 76 (shown in FIG. 4) for calculating the support material volume required to print 3D part 32 from digital part 46, based on user-selected option (i) from menu 52. As shown in FIG. 5, after steps 56 and 58 of method 54 are performed, computer 12 generates grid 112, which is a 3D grid of cells 114 that define a volume bounding box for the tree data structure of digital part 46 (step 60 of method 54).

As mentioned above, in step 60 of method 54, computer 12 does not actually generate a physical or graphical grid 112 (unless desired). Rather, the x-y-z locations of the central coordinate points of cells 114 (or other selected coordinate locations within cells 114) are retained in the memory of computer 12.

For example, expanded cells 114a-114c respectively include central coordinate points 116a-116c, each of which are located at the centers of their respective cell 114a-114c. In this example, in which cells 114 have the same volumes, central coordinate points 116a and 116b are offset from each other along the z-axis by a single increment. Similarly, central coordinate points 116b and 116c are offset from each other along the x-axis by the same single increment. Cells 114 aligned along the y-axis also have central coordinate points offset from each other by the same single increment.

Accordingly, SIG engine 50 may use a preset volume for cells 114 to reduce processing time when generating grid 112. As shown, this positions the central coordinate points (e.g., points 116a-116c) of cells 114 at the same preset increments from each other. In alternative embodiments, however, cells 114 may have different geometric shapes (e.g., rectangular, pyramidal, and the like) and/or may have different volumes from each other, which may affect the locations of the central coordinate points of the cells.

Furthermore, SIG engine 50 may provide a user option to select the desired volumes for cells 114. In general, smaller volumes for cells 114 provide more accurate calculations, and vice versa. However, smaller volumes for cells 114 also increase the number of cells that define the volume bounding box for digital part 46, thereby increasing the total number of cells that are pinged. This can increase the processing time required to perform the calculations.

As such, SIG engine 50 desirably operates with cell volumes that balance accuracy and processing time. Examples of suitable volumes for each cell 114 of grid 112 range from about $1 \times 10^{-9}$ cubic inches (e.g., a cube having sides of about 0.001 inches) to about 0.001 cubic inches (e.g., a cube having sides of about 0.1 inches). In one embodiment, examples of suitable volumes for each cell 114 range from about $1.25 \times 10^{-7}$ cubic inches (e.g., a cube having sides of about 0.005 inches) to about $1.25 \times 10^{-4}$ cubic inches (e.g., a cube having sides of about 0.05 inches).

As further shown in FIG. 5, grid 112 has six sides facing the major directional axes of the x-y-z coordinate system, namely top side 118a facing the positive direction along the z-axis, a bottom side (not shown in FIG. 5) facing the negative direction along the z-axis, front side 118b facing the positive direction along the x-axis, a rear side (not shown in FIG. 5) facing the negative direction along the x-axis, a right side 118c facing the positive direction along the y-axis, and a left side (not shown in FIG. 5) facing the negative direction along the y-axis. The terms top, bottom, front, rear, right, and left are not intended to be limiting on any particular orientation, and are used herein merely for ease of discussion.

After grid 112 is generated, SIG engine 50 then calculates the volume of support material required to print 3D part 32 with system 10, pursuant to step 66 of method 54, and as described by method 76. Accordingly, pursuant to step 78 of method 76, computer 12 selects a first directional axis for performing the analysis. For convenience, the positive direction along the z-axis may be selected as the first directional axis to perform the analysis.

Figure 6:
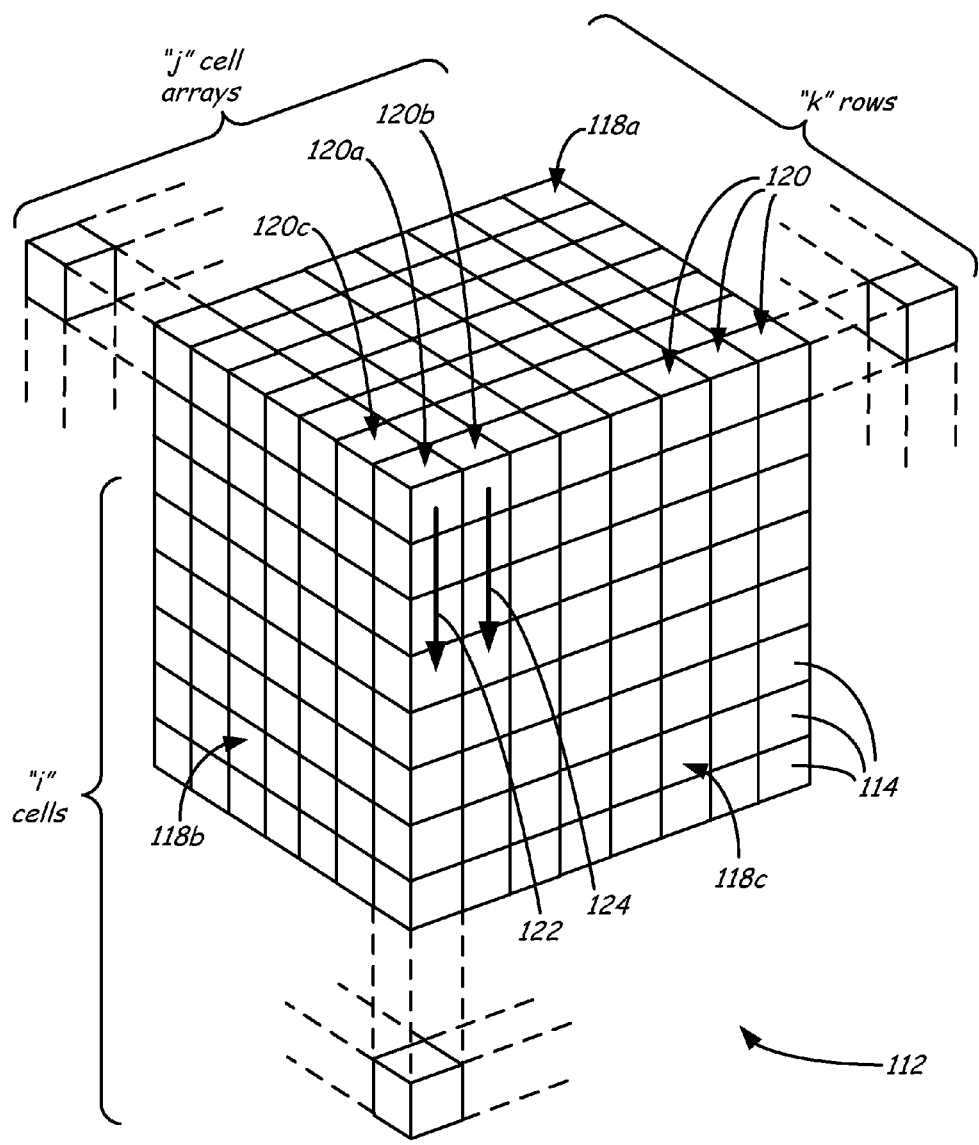
FIG. 6 is a perspective view of the generated grid of cells, illustrating a first set of cell arrays based on a first directional axis that is a positive direction along a z-axis.

FIG. 6 further illustrates grid 112 and maintains the same orientation as shown in FIG. 5. As shown in FIG. 6, for the positive direction along the z-axis, cells 114 are arranged in multiple cell arrays, referred to as cell arrays 120, each extending downward along the z-axis between top side 118a and the bottom side of grid 112 (not shown in FIG. 6). Each cell array 120 includes "i" number of cells 114 along the z-axis. For ease of discussion, cell arrays 120 may be organized into rows aligned with the x-z plane. Grid 112 includes "j" number of cell arrays 120 per row, and "k" number of rows of cell arrays 120 along the y-axis, such that grid 112 includes a total number of j×k cell arrays 120, and a total number of i×j×k cells 114.

Pursuant to step 80 of method 76, computer 12 may proceed to a first cell array 120, which may located at any suitable location within grid 112. For convenience, the first cell array 120 may be a corner cell array, such as cell array 120a, which is located in the first row at the corner of top side 118a, front side 118b, and right side 118c. Pursuant to steps 82-94 of method 76, computer 12 then analyzes cells 114 in cell array 120a in a downward direction, as illustrated by arrow 122 (as discussed further below in FIGS. 7A-7D).

After cell array 120a is analyzed, computer 12 then proceeds to the next cell array 120 (step 96). In the current example, the next cell array 120 is the adjacent cell array 120 in the first row along the x-axis, referred to as cell array 120b. Pursuant to steps 82-94 of method 76, computer 12 then analyzes cells 114 in cell array 120a in a downward direction, as illustrated by arrow 124 (as also discussed further below in FIGS. 7A-7D). Computer 12 may then repeat steps 82-96 of method 76 for each successive cell array 120 in the current row.

When the first row of cell arrays 120 have been analyzed, computer 12 may then proceed to the first cell array 120 in the second row of cell arrays 120, referred to as cell array 120c (step 96). Computer 12 then repeats steps 82-96 for each cell array 120 in the second row, and for each remaining row of cell arrays 120 until all cell arrays 120 of grid 112 are analyzed. Analysis of cell arrays 120 in this row-based manner provides a convenient and organized way to proceed through steps 82-96 of method 76. However, SIG engine 50 may alternatively be configured such that computer 12 analyzes cell arrays 120 in different orders, as desired.

Figure 7A:
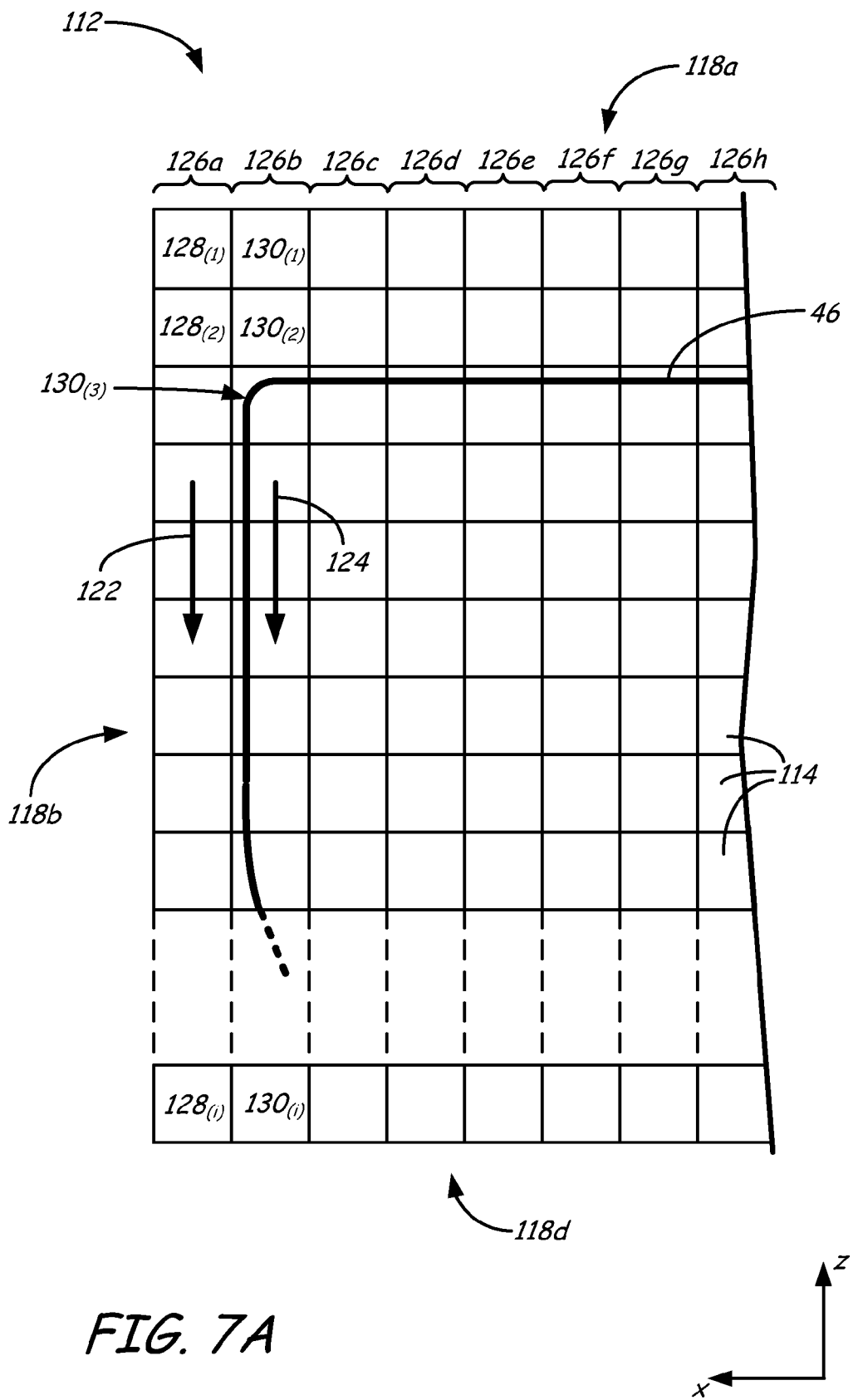
FIGS. 7A-7D illustrate a process for analyzing the first set of cell arrays, where

FIG. 7A-7D illustrate the application of steps 82-96 for a given row of cell arrays 120, which includes cell arrays 126a-126h, and also depict bottom side 118d of grid 112. As shown in FIG. 7A, pursuant to step 82 of method 76, computer 12 may proceed to a first cell 114 in cell array 126a, referred to as cell $128_{(1)}$. Computer 12 then pings cell $128_{(1)}$ to determine whether a subset of the tree data structure for digital part 46 resides in cell $128_{(1)}$ (step 84).

In the shown example, the tree data structure for digital part 46 does not include any subsets in cell $128_{(1)}$ (step 86). As such, computer 12 then checks whether the cell $128_{(1)}$ is the last cell 114 in cell array 126a (step 88). Since cell array 126a contains additional cells 114, computer 12 then proceeds to the next successive cell 114 in cell array 126a (step 90). The next successive cell in cell array 126a from cell $128_{(1)}$ is determined by proceeding from cell $128_{(1)}$ to the next cell 114 along cell arrays 126a that is in an opposite direction from the directional axis selected in step 78. In this case, the currently selected directional axis is the positive direction along the z-axis. As such, the next successive cell 114 in cell array 126a from cell $128_{(1)}$ is located downward along the z-axis from cell $128_{(1)}$ (i.e., in the negative direction along the z-axis, as illustrated by arrow 122), and is referred to as cell $128_{(2)}$.

Computer 12 then pings cell $128_{(2)}$ to determine whether a subset of the tree data structure for digital part 46 resides in cell $128_{(2)}$ (step 84). In this case, the tree data structure for digital part 46 also does not include any subsets in cell $128_{(2)}$ (step 86). In fact, as shown, none of the cells 114 in cell array 126a include any subsets of the tree data structure for digital part 46. As such, pursuant to steps 84-90 of method 76, computer 12 may continue to ping each successive cell 114 downward along cell array 126a until the last cell 114 of cell array 126a located at bottom side 118d of grid 112 (referred to as cell $128_{(i)}$ is pinged.

Since cell array 126a does not include any subsets of the tree data structure for digital part 46, step 92 of method 76 is bypassed, and none of the cells 114 in cell array 126a are designated as "filled". Instead, computer 12 proceeds to the next cell array 120 (step 96, as illustrated by broken line 110 in FIG. 4), which is cell array 126b. Pursuant to step 82 of method 76, computer 12 proceeds to a first cell 114 in cell array 126b, referred to as cell $130_{(1)}$. Computer 12 then pings cell $130_{(1)}$ to determine whether a subset of the tree data structure for digital part 46 resides in cell $130_{(1)}$ (step 84).

As this point, the tree data structure for digital part 46 also does not include any subsets in cell $130_{(1)}$ (step 86). As such, computer 12 performs steps 88 and 90 to proceed to the next subsequent cell 114 in cell array 126b, as illustrated by arrow 124, which is cell $130_{(2)}$. Computer 12 then repeats steps 84-90 for cell $130_{(2)}$, which also does include any subsets of the tree data structure. Therefore, computer 12 performs steps 88 and 90 to proceed to the next successive cell 114 in cell array 126b, as further illustrated by arrow 124, which is cell $130_{(3)}$.

Computer 12 then pings cell $130_{(3)}$ to determine whether a subset of the tree data structure for digital part 46 resides in cell $130_{(3)}$ (step 84). In this case, the tree data structure for digital part 46 does include a subset in cell $130_{(3)}$ (step 86). As such, computer 12 then designates the cell $130_{(3)}$ and all remaining subsequent and unchecked cells 114 in cell array 126b down to cell $130_{(i)}$ as being "filled" (step 92).

Figure 7B:
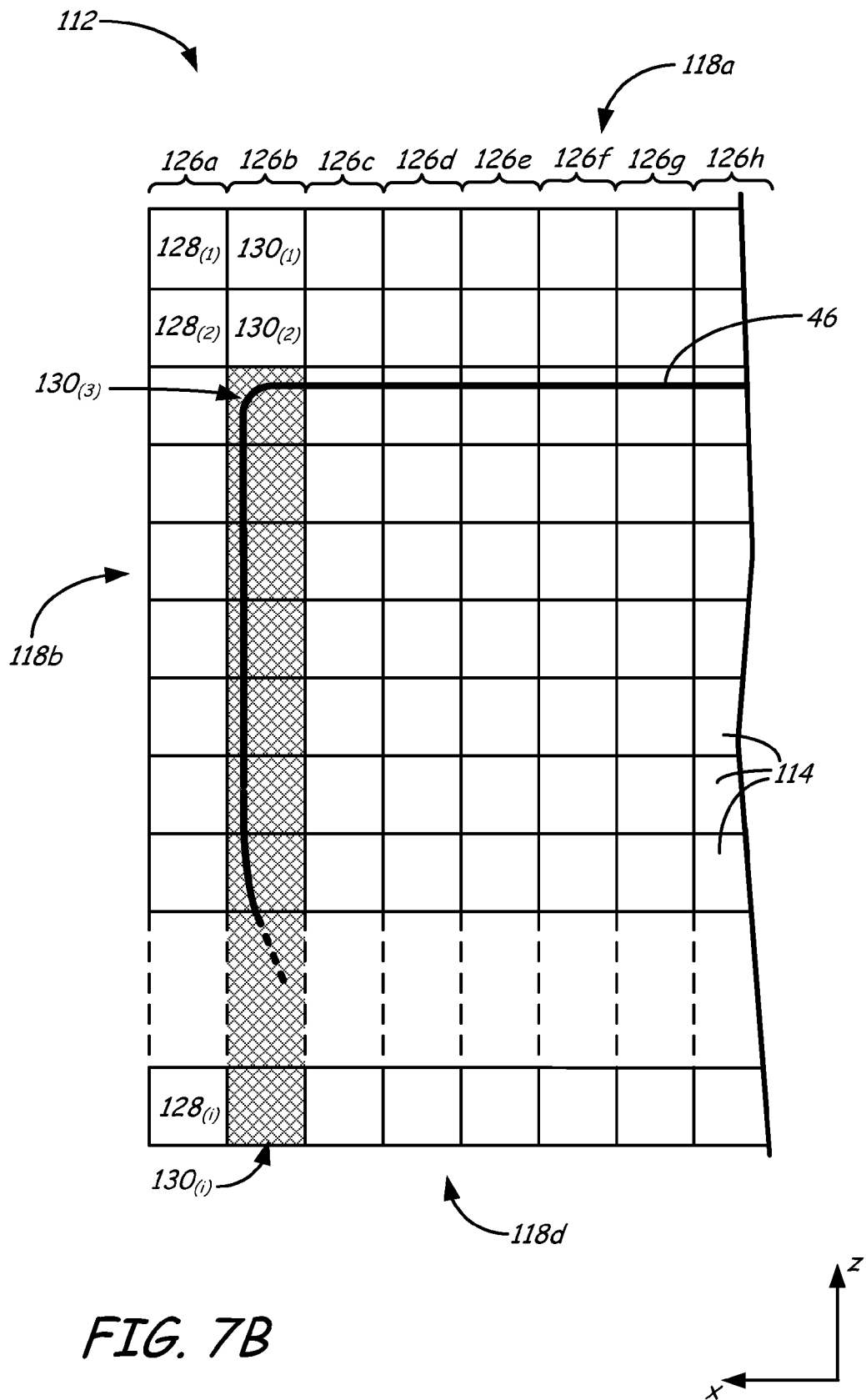

This is illustrated in FIG. 7B, in which cell $130_{(3)}$ and all cells 114 in cell array 126b below cell $130_{(3)}$, down to the last cell $130_{(i)}$, are designated as "filled". This distinguishes the cells of cell array 126b that do not contain any part or support materials (non-filled cells), and the cells of cell array 126b that contain part or support materials (filled cells).

Computer 12 then proceeds to the next cell array 120 (step 96), which is cell array 126c, and repeats steps 82-96 for each remaining cell array 120 of grid 112 (e.g., cell arrays 126d-126h). This results in "filled" designation pattern shown in FIG. 7C.

Figure 7C:
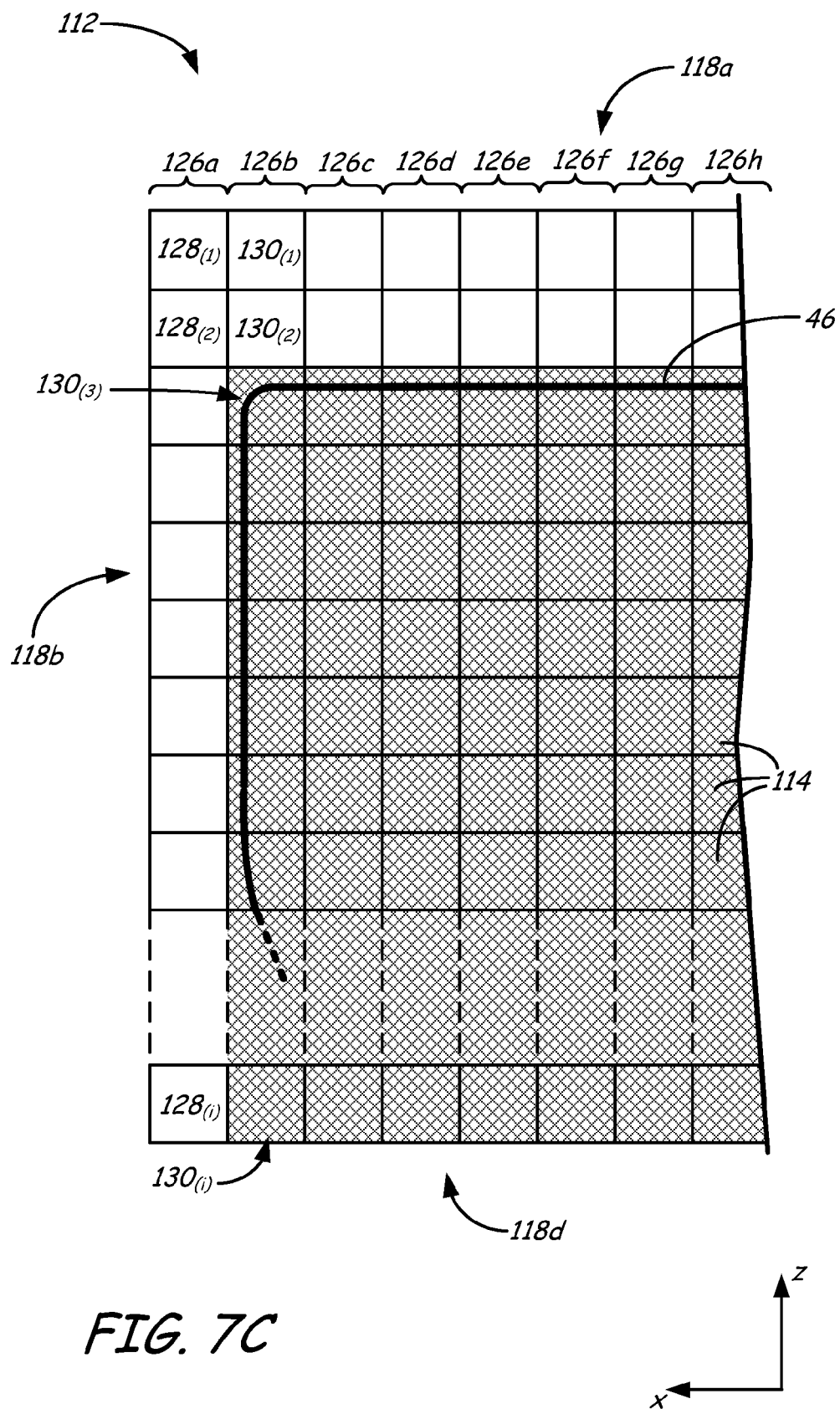
Figure 7D:
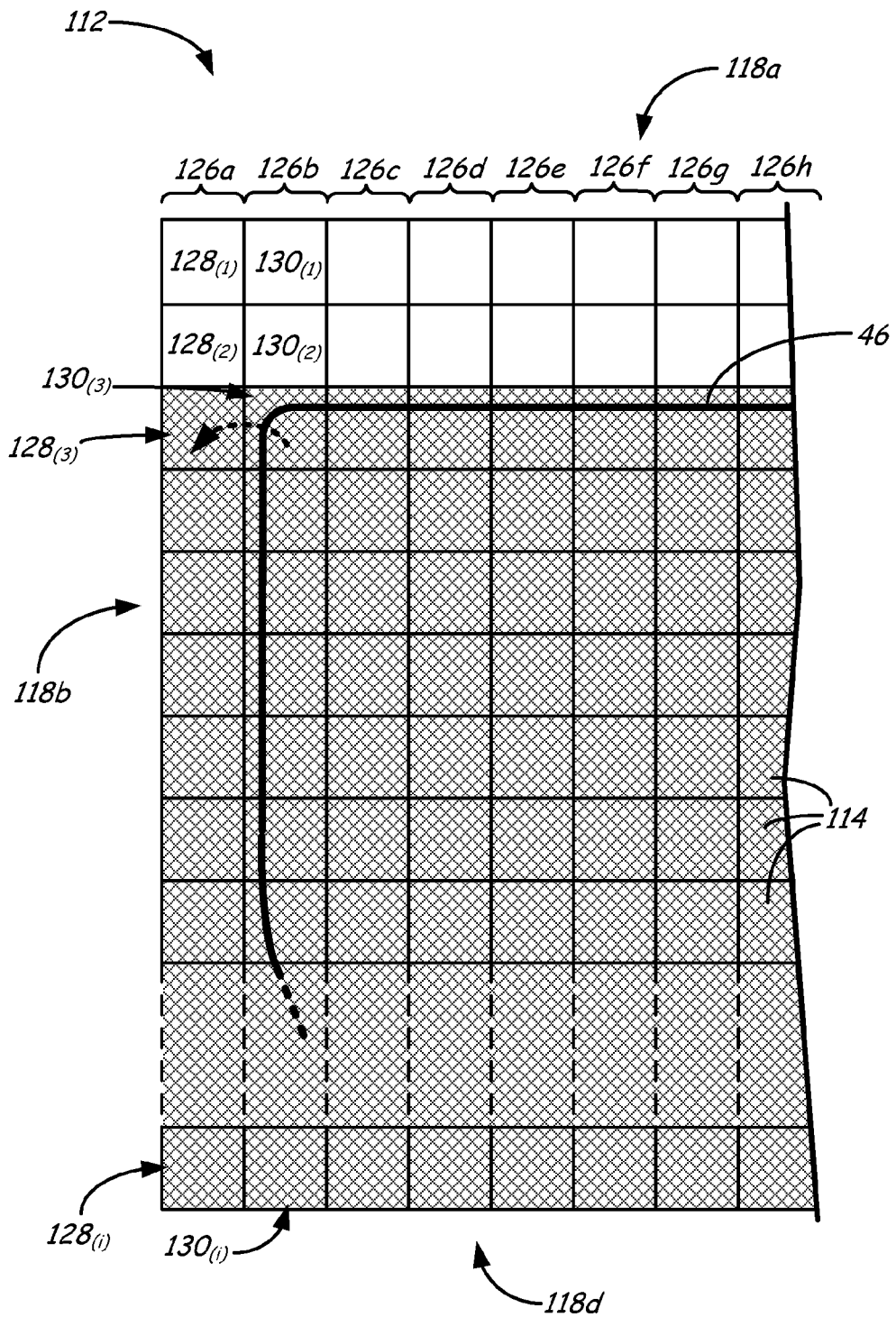

FIG. 7D illustrates an alternative operation of SIG engine 50. As mentioned above, SIG engine 50 may be configured to calculate the support material volumes differently depending on the additive manufacturing process selected with menu 53. FIG. 7D illustrates an embodiment in which support material is also required to support the lateral surfaces of 3D part 32, such for use with some jetting-based additive manufacturing systems.

In this operation, based on the user-selected option with menu 53 of price quoting program 48, when computer 12 designates cell $130_{(3)}$ as "filled", pursuant to step 92 of method 76, computer also increments one or more cell arrays 120 backwards and designates the respective cells 114 as filled. In the current example, cell array 126a is the only cell array that may be backtracked to. As such, computer 12 designates the adjacent cell 114 in cell array 126a (referred to as cell $128_{(3)}$) as filled. Correspondingly, computer 12 also designates all cells 114 in cell array 126a below cell $128_{(3)}$, down to the last cell $128_{(i)}$, are designated as "filled". This accounts for support material that is printed to support the lateral surfaces of 3D part 32 when printing with additive manufacturing systems that requires such support structures.

In a further alternative embodiment, SIG engine 50 may be configured to perform ping jumps, where the pinging operation on a given cell array 120 may jump downward by a preset increment number of cells 114 until a subset of the tree structure for digital part 46 is reached. At that point, computer 12 may backtrack the pinging operation upward within a given jump increment to identify the surface of digital part 46. This ping-jumping technique is suitable for reducing the time required to perform the pinging operations, and is particularly useful in regions of grid 112 that typically do not contain portions of 3D parts, such as in the corners of grid 112.

Figure 8:
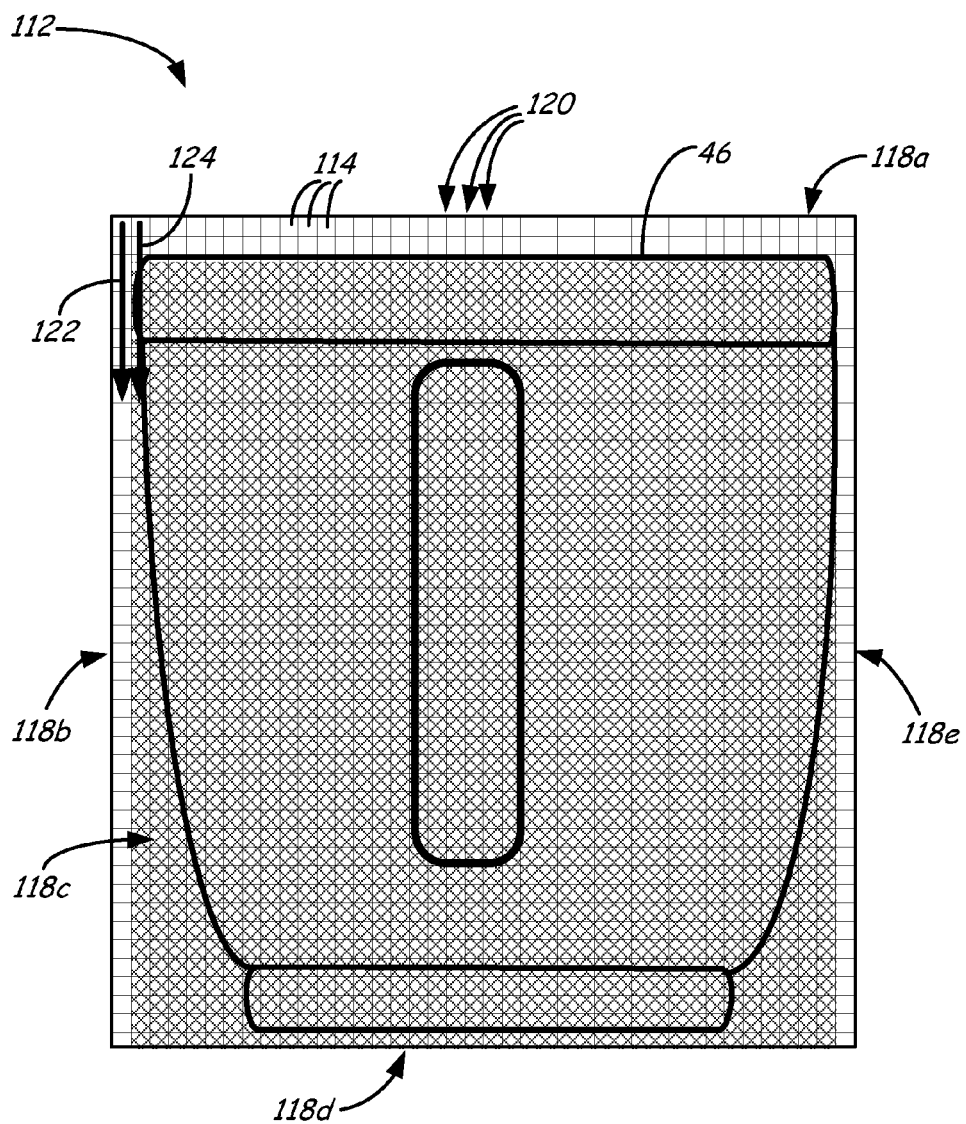
FIG. 8 is a right side view of the grid of cells, depicting the first set of analyzed cell arrays.

FIG. 8 further illustrates the example shown in FIG. 7C, where FIG. 8 is a front view of grid 112 after step 94 of method 76 is completed for the last cell array 120, and depicts rear side 118e. At this point, computer 12 sums the volumes of cells 120 that are designated as filled (step 98), which provides the total filled volume for digital part 46 and the digital support layers. As discussed above, the summing operation in step 94 may alternatively be performed after each designation step 92 in a cumulative manner.

Computer 12 then subtracts the volume of digital part 46 from the summed volume to provide an initial volume of support material needed to print 3D part 32 with system 10 (step 100). Computer 12 may also modify the initial volume of support material to accommodate variations in printing styles, such as column support structures, sparse-fill support structures, and the like (step 102). For example, when using a sparse-fill arrangement, computer 12 may reduce the initial volume of support material by a factor, such as by a preset factor to provide the calculated support material volume for digital part 46 along the positive direction of the z-axis.

Computer 12 then checks whether the positive direction of the z-axis is the last directional axis to analyze (step 104). Under the user-selected option (i) from menu 52, SIG engine 50 is configured to analyze digital part 46 along six or more directional axes (from steps 62a and 64a of method 54). In this situation, computer 12 then proceeds to the next directional axis (step 106) and repeats steps 80-106.

Figure 9:
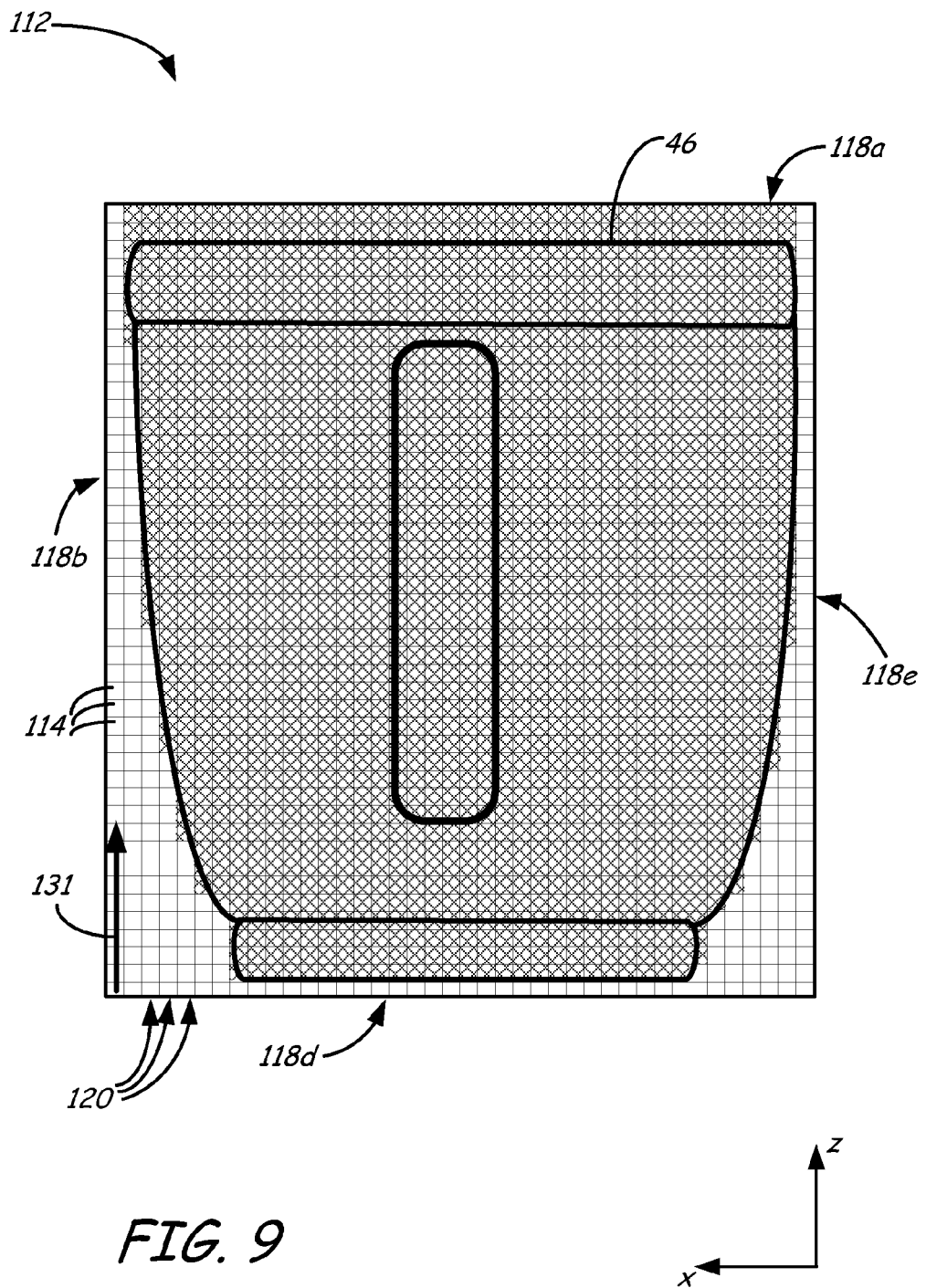
FIG. 9 is a right side view of the grid of cells, depicting a second set of analyzed cell arrays based on a second directional axis that is a negative direction along the z-axis.

As shown in FIG. 9, the next directional axis may be the negative direction along the z-axis. In this case, the same cell arrays 120 are used, but are analyzed in an inverted manner compared to the previous operation shown in FIGS. 7A-7D and 8. In other words, the first cell 114 in each cell array 120 is located adjacent to bottom side 118d, and the last cell 114 in each cell array 120 is located adjacent to top side 118a. Accordingly, for each cell array 120, cells 114 are pinged upward during steps 84-92 of method 76, as illustrated by arrow 131.

When a given pinged cell 114 includes a subset of the tree data structure for digital part 46 (steps 84 and 86), computer 12 then designates the pinged cell and all remaining subsequent and unchecked cells 114 in the current cell array 120, upward toward the last cell 114, as being "filled" (step 92). Therefore, after computer 12 completes the analysis of steps 80-104, the cells 114 designated as filled extend upward, as shown in FIG. 9. The resulting calculated support material volume is then based on this upward arrangement, which corresponds to a situation in which digital part 46 is oriented such that the negative direction along the z-axis becomes the upward direction for printing 3D part 32.

Computer 12 then checks whether the negative direction of the z-axis is the last directional axis to analyze (step 104). Under the current situation, computer 12 may proceed to a next directional axis (step 106) and repeat steps 80-106. For example, the next directional axis may be the positive direction along the y-axis.

Figure 10:
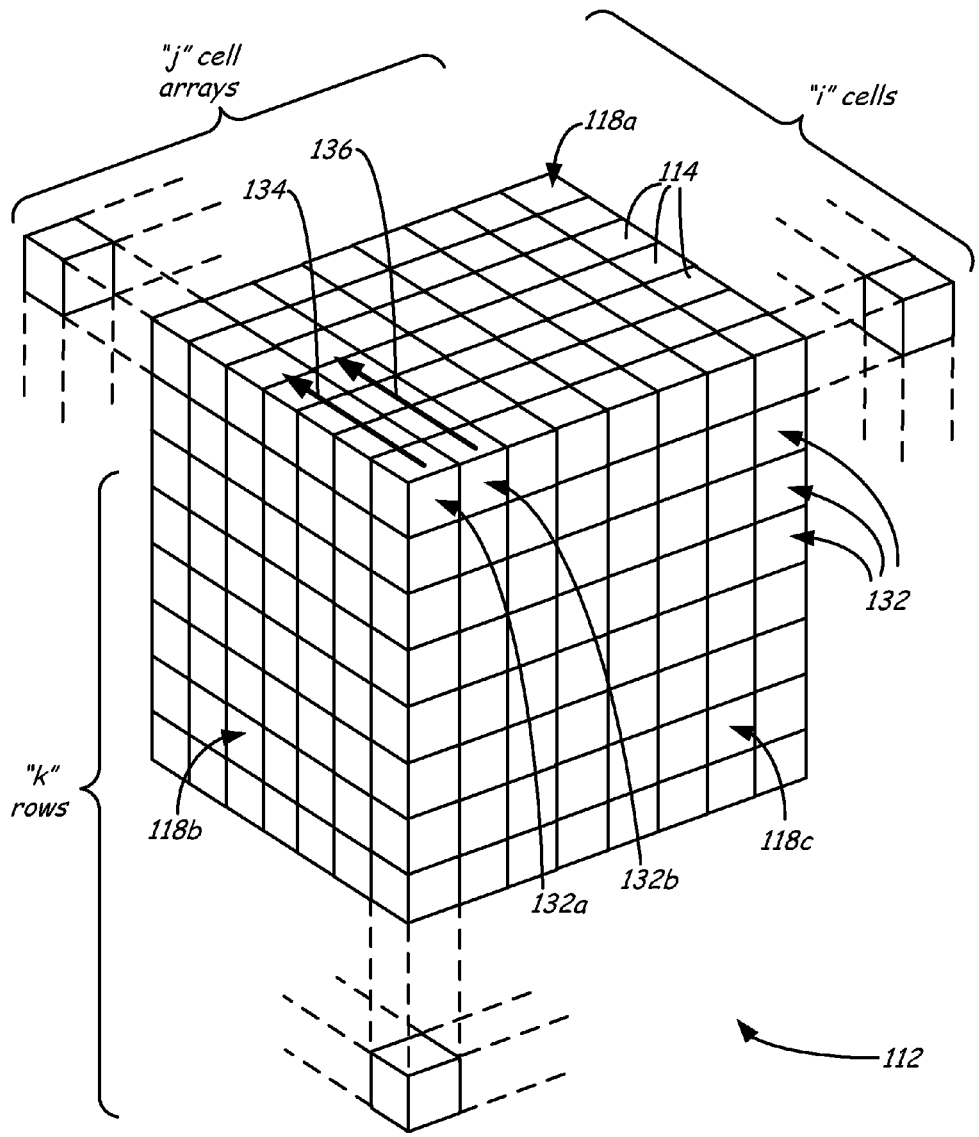
FIG. 10 is a perspective view of the generated grid of cells, illustrating a third set of cell arrays based on a third directional axis that is a positive direction along a y-axis.

As shown in FIG. 10, for the positive direction along the y-axis, cells 114 are arranged in multiple cell arrays, referred to as cell arrays 132 extending laterally along the y-axis between right side 118c and the left side of grid 112 (not shown in FIG. 10). Each cell array 132 includes "i" number of cells 114 along the y-axis. For ease of discussion, cell arrays 132 may be organized into rows aligned with the x-y plane. Grid 112 includes "j" number of cell arrays 132 per row, and "k" number of rows of cell arrays 132 along the z-axis, such that grid 112 includes a total number of j×k cell arrays 132, and a total number of i×j×k cells 114 (same number as above for cell arrays 120 along the z-axis).

Computer 12 may proceed to a first cell array 132 (step 80 of method 76), which may located at any suitable location within grid 112. For convenience, the first cell array 132 may be a corner cell array, such as cell array 132a, which is located in the first row at the corner of top side 118a, front side 118b, and right side 118c. Pursuant to steps 82-94 of method 76, computer 12 then analyzes cells 114 in cell array 132a in a leftward direction, as illustrated by arrow 134.

After cell array 132a is analyzed, computer 12 then proceeds to the next cell array 132 (step 96). In the current example, the next cell array 132 is the adjacent cell array 132 in the first row along the y-axis, referred to as cell array 132b. Pursuant to steps 82-94 of method 76, computer 12 then analyzes cells 114 in cell array 132b in a leftward direction, as illustrated by arrow 136. Computer 12 may then repeat steps 82-96 of method 76 for each successive cell array 132 in the current row along the y-axis. When the first row of cell arrays 132 have been analyzed, computer 12 may then proceed to the first cell array 132 in the second row of cell arrays 132, and may repeat steps 82-96 for each cell array 132 in the second row, and for each remaining row of cell arrays 132 until all cell arrays 132 of grid 112 are analyzed.

Figure 11:
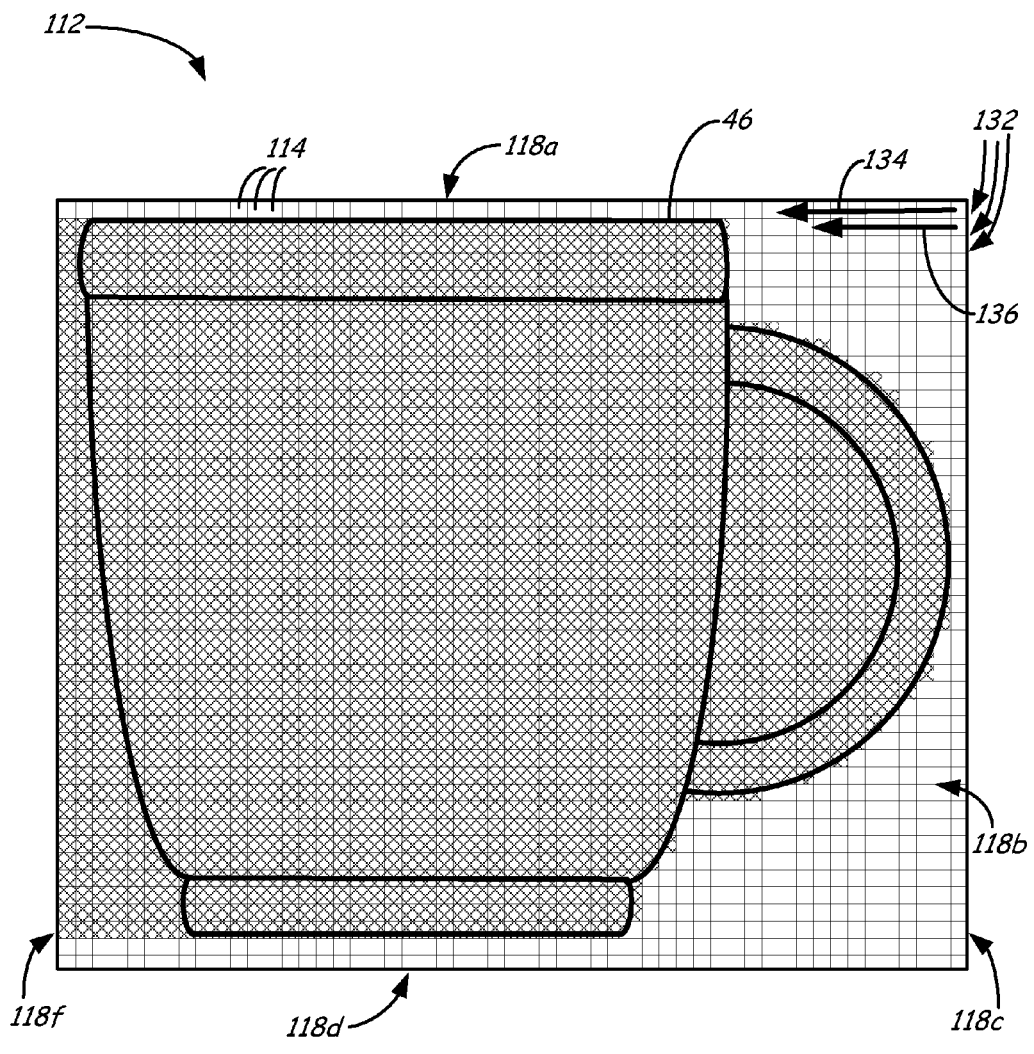
FIG. 11 is a front view of the grid of cells, depicting the third set of analyzed cell arrays.

This is shown in FIG. 11, where cell arrays 132 extend along the y-axis, between right side 118c and left side 118f. Cell arrays 132 may be analyzed in the same manner as discussed above for cell arrays 120, where the first cell 114 in each cell array 132 is located adjacent to right side 118c, and the last cell 114 in each cell array 132 is located adjacent to left side 118f. Therefore, for each cell array 132, cells 114 are pinged from right-to-left during steps 84-92 of method 76 (e.g., as illustrated by arrows 134 and 136).

When a given pinged cell 114 includes a subset of the tree data structure for digital part 46 (steps 84 and 86), computer 12 then designates the pinged cell and all remaining subsequent and unchecked cells 114 in the current cell array 132, leftward toward the last cell 114, as being "filled" (step 92). Accordingly, after computer 12 completes the analysis of steps 80-104, the cells 114 designated as filled extend leftward, as shown in FIG. 11. Thus, the resulting calculated support material volume is based on this leftward arrangement, which corresponds to a situation in which digital part 46 is oriented such that the positive direction along the y-axis becomes the upward direction for printing 3D part 32.

Computer 12 then checks whether the positive direction of the y-axis is the last directional axis to analyze (step 104). Under the current situation, computer 12 may proceed to the next directional axis (step 106) and repeat steps 80-106.

Figure 12:
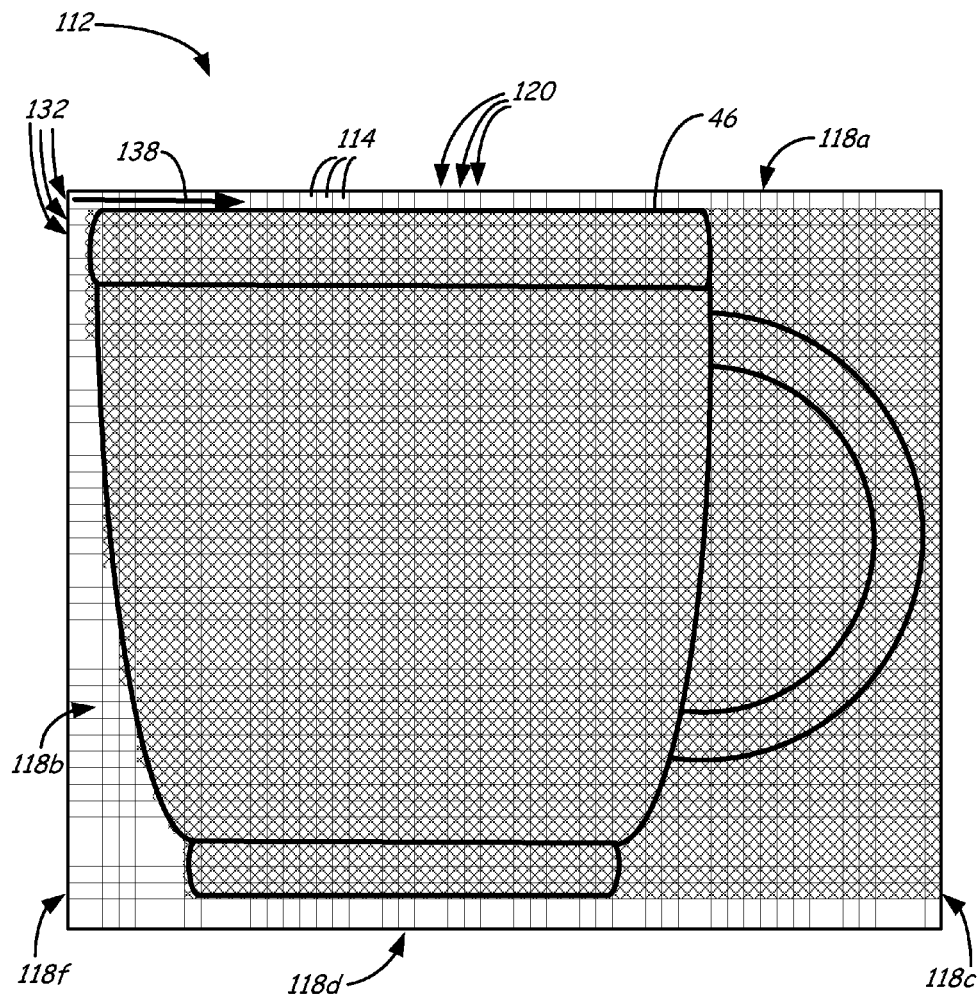
FIG. 12 is a front view of the grid of cells, depicting a fourth set of analyzed cell arrays based on a fourth directional axis that is a negative direction along the y-axis.

As shown in FIG. 12, the next directional axis may be the negative direction along the y-axis. In this case, the same cell arrays 132 are used, but are analyzed in an inverted manner compared to the previous operation shown in FIGS. 10 and 11. In other words, the first cell 114 in each cell array 132 is located adjacent to left side 118f, and the last cell 114 in each cell array 132 is located adjacent to right side 118c. Therefore, for each cell array 132, cells 114 are pinged rightward during steps 84-92 of method 76, as illustrated by arrow 138.

When a given pinged cell 114 includes a subset of the tree data structure for digital part 46 (steps 84 and 86), computer 12 then designates the pinged cell and all remaining subsequent and unchecked cells 114 in the current cell array 132, rightward toward the last cell 114, as being "filled" (step 92). Accordingly, after computer 12 completes the analysis of steps 80-104, the cells 114 designated as filled extend rightward, as shown in FIG. 12. Thus, the resulting calculated support material volume is based on this leftward arrangement, which corresponds to a situation in which digital part 46 is oriented such that the negative direction along the y-axis becomes the upward direction for printing 3D part 32.

Computer 12 then checks whether the negative direction of the y-axis is the last directional axis to analyze (step 104). Under the current situation, computer 12 may proceed to the next directional axis (step 106) and repeat steps 80-106. For example, the next directional axis may be the positive direction along the x-axis.

Figure 13:
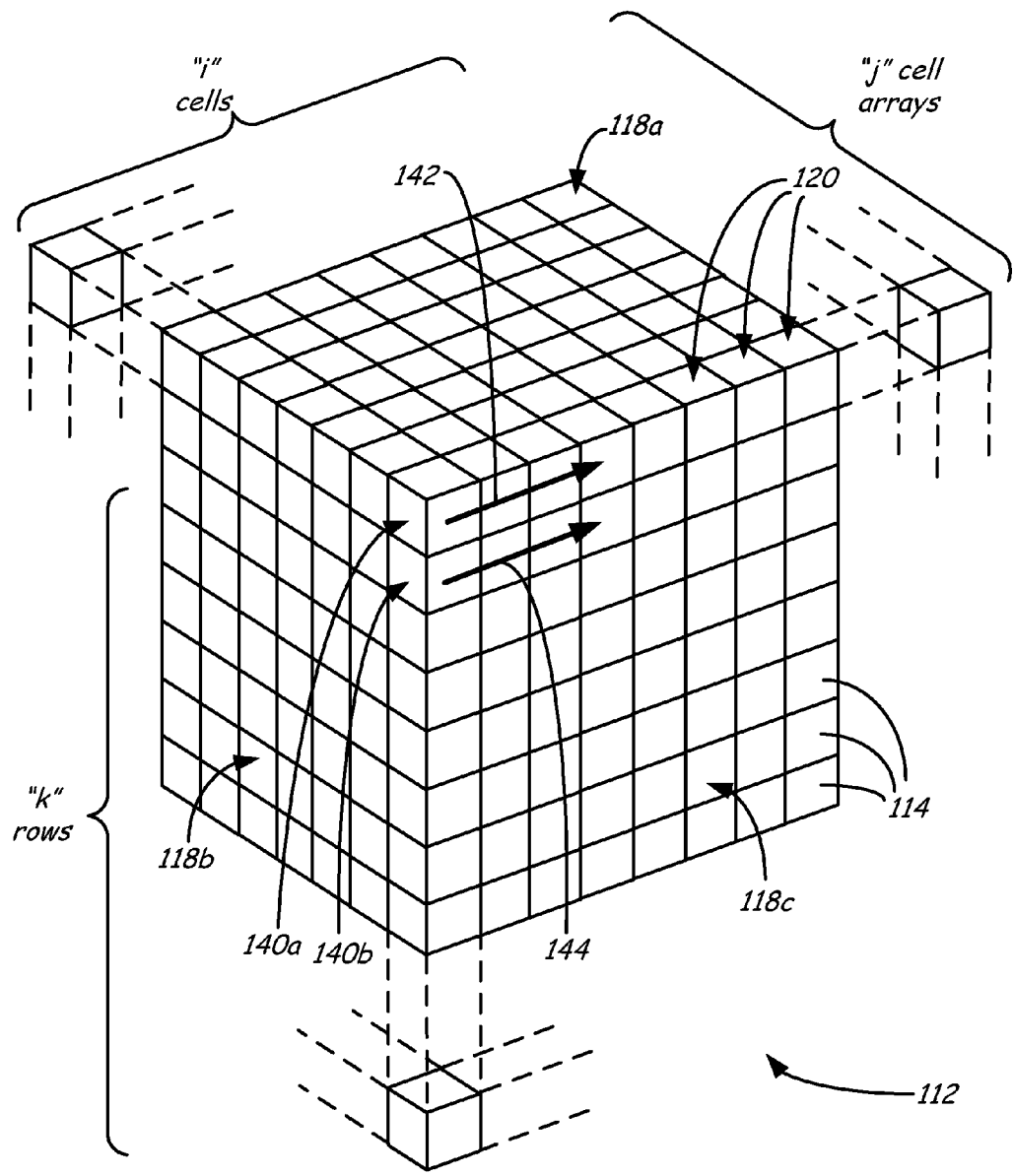
FIG. 13 is a perspective view of the generated grid of cells, illustrating a fifth set of cell arrays based on a fifth directional axis that is a positive direction along an x-axis.

As shown in FIG. 13, for the positive direction along the x-axis, cells 114 are arranged in multiple cell arrays, referred to as cell arrays 140 extending laterally along the x-axis between front side 118b and rear side 118e (not shown in FIG. 13). Each cell array 140 includes "i" number of cells 114 along the x-axis. For ease of discussion, cell arrays 140 may be organized into rows aligned with the y-z plane. Grid 112 includes "j" number of cell arrays 140 per row, and "k" number of rows of cell arrays 140 along the z-axis, such that grid 112 includes a total number of j×k cell arrays 140, and a total number of i×j×k cells 114 (same number as above for cell arrays 120 along the z-axis, and of cell arrays 132 along the y-axis).

Computer 12 may proceed to a first cell array 140 (step 80 of method 76), which may located at any suitable location within grid 112. For convenience, the first cell array 140 may be a corner cell array, such as cell array 140a, which is located in the first row at the corner of top side 118a, front side 118b, and right side 118c. Pursuant to steps 82-94 of method 76, computer 12 then analyzes cells 114 in cell array 140a in a rearward direction, as illustrated by arrow 142.

After cell array 140a is analyzed, computer 12 then proceeds to the next cell array 140 (step 96). In the current example, the next cell array 140 is the adjacent cell array 140 in the first row along the x-axis, referred to as cell array 140b. Pursuant to steps 82-94 of method 76, computer 12 then analyzes cells 114 in cell array 140b in a rearward direction, as illustrated by arrow 144. Computer 12 may then repeat steps 82-96 of method 76 for each successive cell array 140 in the current row. When the first row of cell arrays 140 have been analyzed, computer 12 may then proceed to the first cell array 140 in the second row of cell arrays 140, and may repeat steps 82-96 for each cell array 140 in the second row, and for each remaining row of cell arrays 140 until all cell arrays 140 of grid 112 are analyzed.

Figure 14:
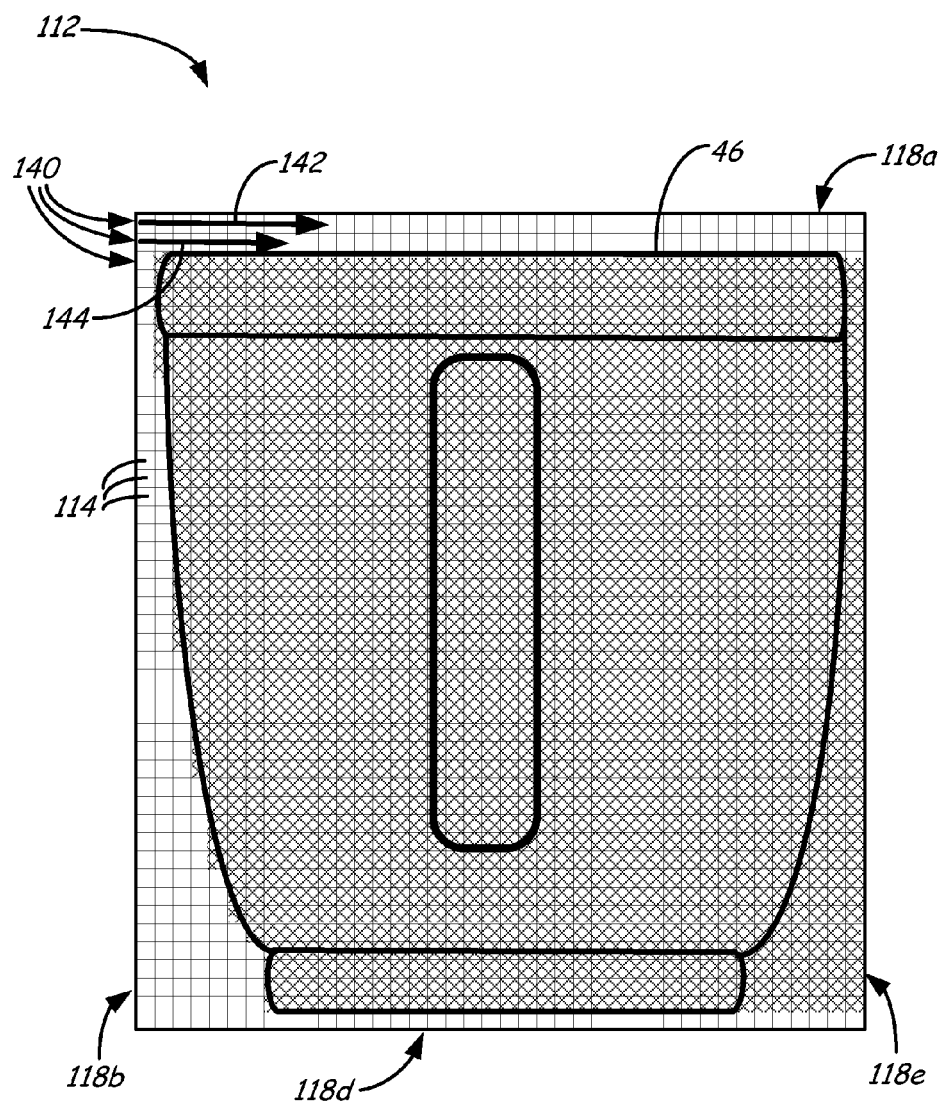
FIG. 14 is a front view of the grid of cells, depicting the fifth set of analyzed cell arrays.

This is illustrated in FIG. 14, where cell arrays 140 are oriented along the x-axis, between front side 118b and rear side 118e. Cell arrays 140 may be analyzed in the same manner as discussed above for cell arrays 120, where the first cell 114 in each cell array 140 is located adjacent to front side 118b, and the last cell 114 in each cell array 140 is located adjacent to rear side 118f. Therefore, for each cell array 140, cells 114 are pinged from front-to-rear during steps 84-92 of method 76 (e.g., as illustrated by arrows 142 and 144).

When a given pinged cell 114 includes a subset of the tree data structure for digital part 46 (steps 84 and 86), computer 12 then designates the pinged cell and all remaining subsequent and unchecked cells 114 in the current cell array 140, rearward toward the last cell 114, as being "filled" (step 92). Accordingly, after computer 12 completes the analysis of steps 80-104, the cells 114 designated as filled extend rearward, as shown in FIG. 14. Thus, the resulting calculated support material volume is based on this rearward arrangement, which corresponds to a situation in which digital part 46 is oriented such that the positive direction along the x-axis becomes the upward direction for printing 3D part 32.

Computer 12 then checks whether the positive direction of the x-axis is the last directional axis to analyze (step 104).

Under the current situation, computer 12 may proceed to the next directional axis (step 106) and repeat steps 80-106.

Figure 15:
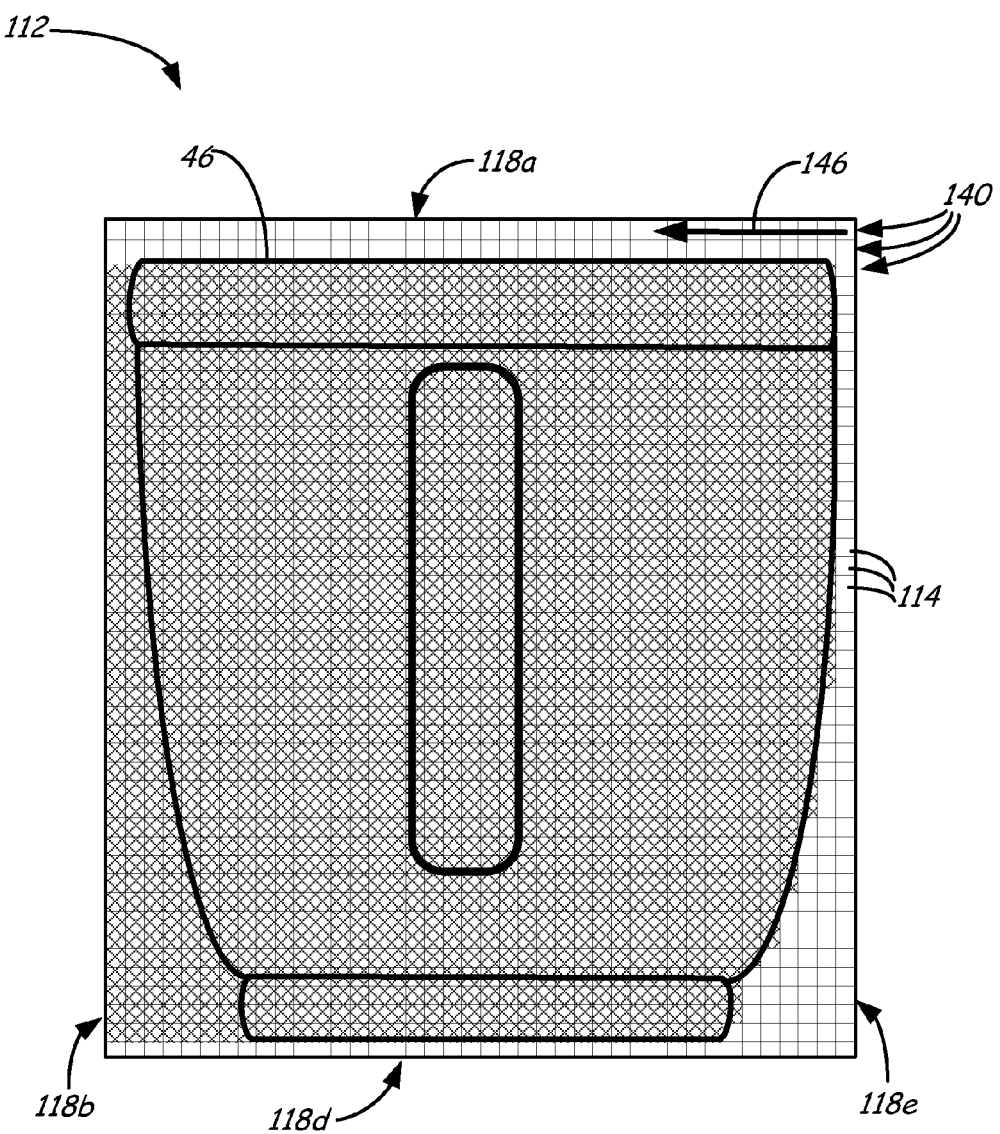
FIG. 15 is a front view of the grid of cells, depicting a sixth set of analyzed cell arrays based on a sixth directional axis that is a negative direction along the x-axis.

As shown in FIG. 15, the next directional axis may be the negative direction along the x-axis. In this case, the same cell arrays 140 are used, but are analyzed in an inverted manner compared to the previous operation shown in FIGS. 13 and 14. In other words, the first cell 114 in each cell array 140 is located adjacent to rear side 118e, and the last cell 114 in each cell array 140 is located adjacent to front side 118b. Therefore, for each cell array 140, cells 114 are pinged forward during steps 84-92 of method 76, as illustrated by arrow 146.

When a given pinged cell 114 includes a subset of the tree data structure for digital part 46 (steps 84 and 86), computer 12 then designates the pinged cell and all remaining subsequent and unchecked cells 114 in the current cell array 140, forward toward the last cell 114, as being "filled" (step 92). Accordingly, after computer 12 completes the analysis of steps 80-104, the cells 114 designated as filled extend forward, as shown in FIG. 15. Thus, the resulting calculated support material volume is based on this forward arrangement, which corresponds to a situation in which digital part 46 is oriented such that the negative direction along the x-axis becomes the upward direction for printing 3D part 32.

As illustrated in FIGS. 7A-7D and 8-15, when proceeding to each successive directional axis, computer 12 desirably does not reorient digital part 46, which can take up valuable processing power. Instead, computer 12 merely designates the given selected directional axis as the new "upward" direction and repeats steps 80-106 for each new upward direction.

Computer 12 may then check whether the negative direction of the x-axis is the last directional axis to analyze (step 104). In the current example, SIG engine 50 is configured to calculate the support material volume for digital part 46 only along the six major directional axes. As such, computer 12 then selects the directional axis that corresponds to the lowest calculated support material volume (step 68 of method 54). In this case, computer 12 selects the positive direction along the z-axis, as shown in FIG. 8, which is the directional axis that corresponds to the lowest calculated support material.

Since this is the same orientation of digital part 46 as received, step 70 of method 54 may be optionally bypassed, and computer 12 may output the support material volume to price quoting program 48 (step 72 of method 54). Computer 12 may also export new digital part 46a (step 74 of method 54) for printing 3D part 32 with system 10. However, since digital part 46 and digital part 46a have the same orientation, computer 12 may alternatively bypass step 74 of method 54, and use digital part 46 to print 3D part 32 with system 10.

As shown, SIG engine 50 is suitable for quickly calculating support material volumes needed to print 3D parts using the steps of methods 54 and 76. For example, when configured to operate with cells 114 having dimensions of 0.01 inches×0.01 inches×0.01 inches ($1 \times 10^{-6}$ cubic inches per cell), SIG engine 50 can calculate a needed volume of support material for a given 3D part in about 5-10 seconds per directional axis, or 30-60 seconds for all six major directional axes. SIG engine 50 is accordingly suitable in combination with price quoting program 48 to provide instant price quotes. However, SIG engine 50 may also be used in conjunction with a variety of different processes, such as tool-path generation processes, run-time and scheduling determinations, and the like.

Figure 16:
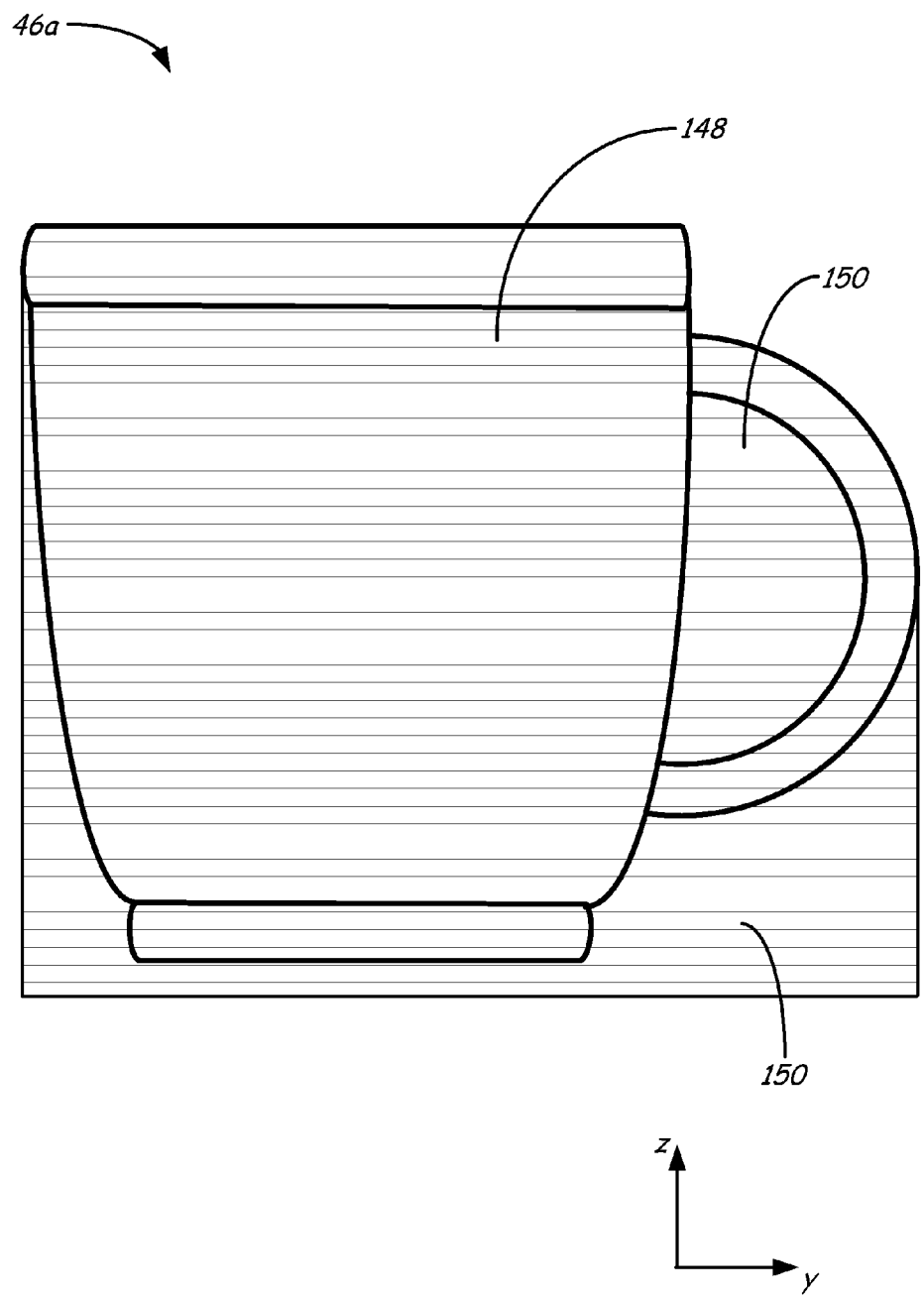
FIG. 16 is a front view of an oriented digital part with digital support layers, illustrating a slicing embodiment of the Solid Identification Grid engine.

For example, as shown in FIG. 16, when used in conjunction with a tool-path generation process, cells 114 of grid 112 may have dimensions that correspond to a sliced layer increment for printing or otherwise building a 3D part with a particular additive manufacturing system (e.g., system 10). In this embodiment, the digital part 46a exported during step 74 of method 54 may include the oriented part for 3D part 32 (referred to as digital part 148), and also the digital support layers for support structure 34 (referred to as digital support layers 150). Furthermore, because cells 114 have dimensions that correspond to a sliced layer increment, SIG engine 50 effectively functions as a high-speed slicing program for orienting and slicing digital part 46 into multiple horizontal layers, and for generating digital support layers 150.

In one embodiment, SIG engine 50 may also be configured to generate tool-path instructions and other related information for each layer of digital part 148 and digital support layers 150, and the resulting data may be transmitted to host computer 16 and/or system 10. System 10 may then print 3D part 32 and support structure 34 based on the received data, where the volume of support structure 34 corresponds to the volume of support material calculated by SIG engine 50.

Figure 17A:
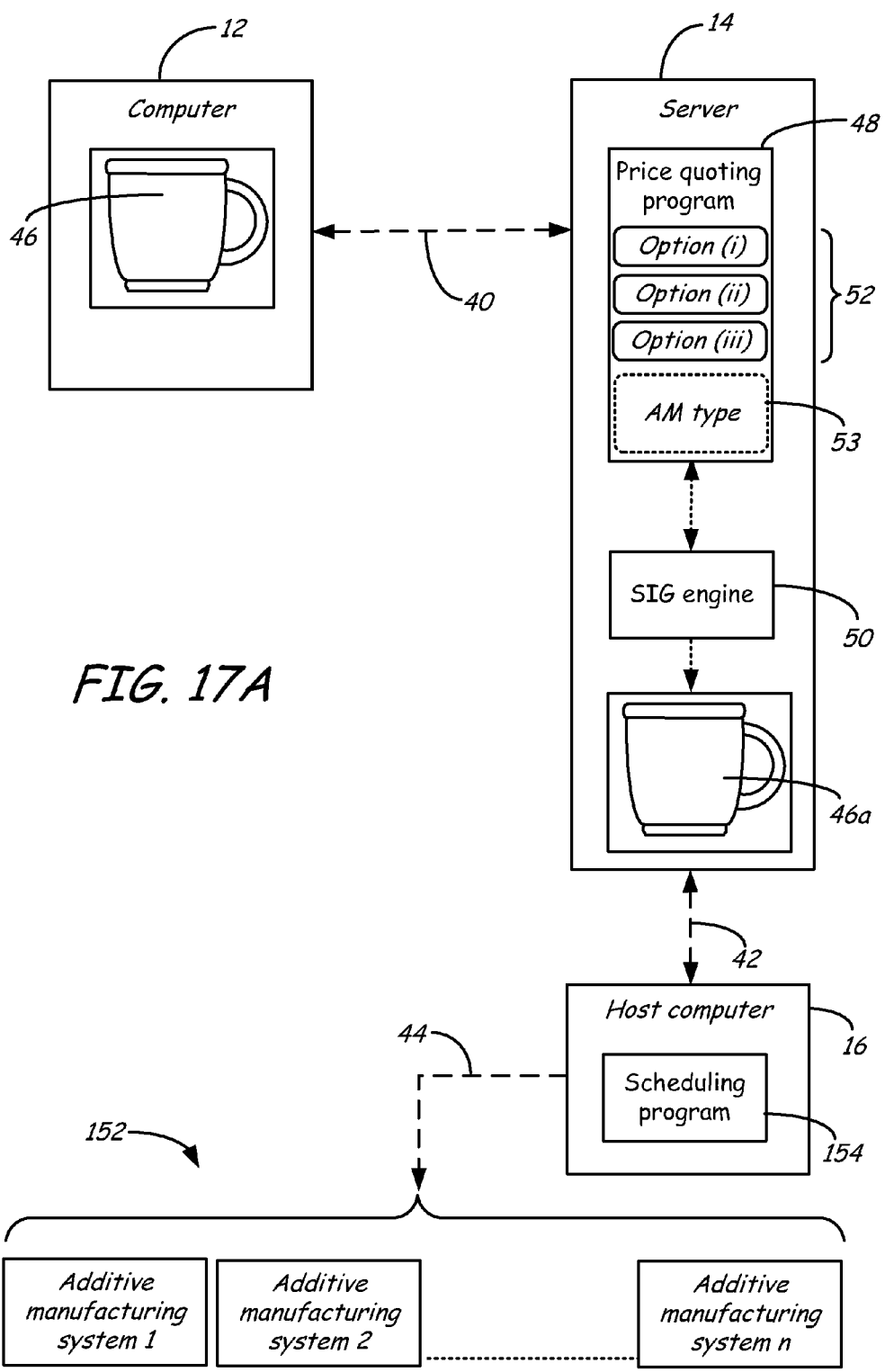
FIG. 17A is an alternative schematic illustration of the computer-based systems shown in FIG. 2A, illustrating the computer-based systems in use with a farm of additive manufacturing systems and a scheduling program.
Figure 17B:
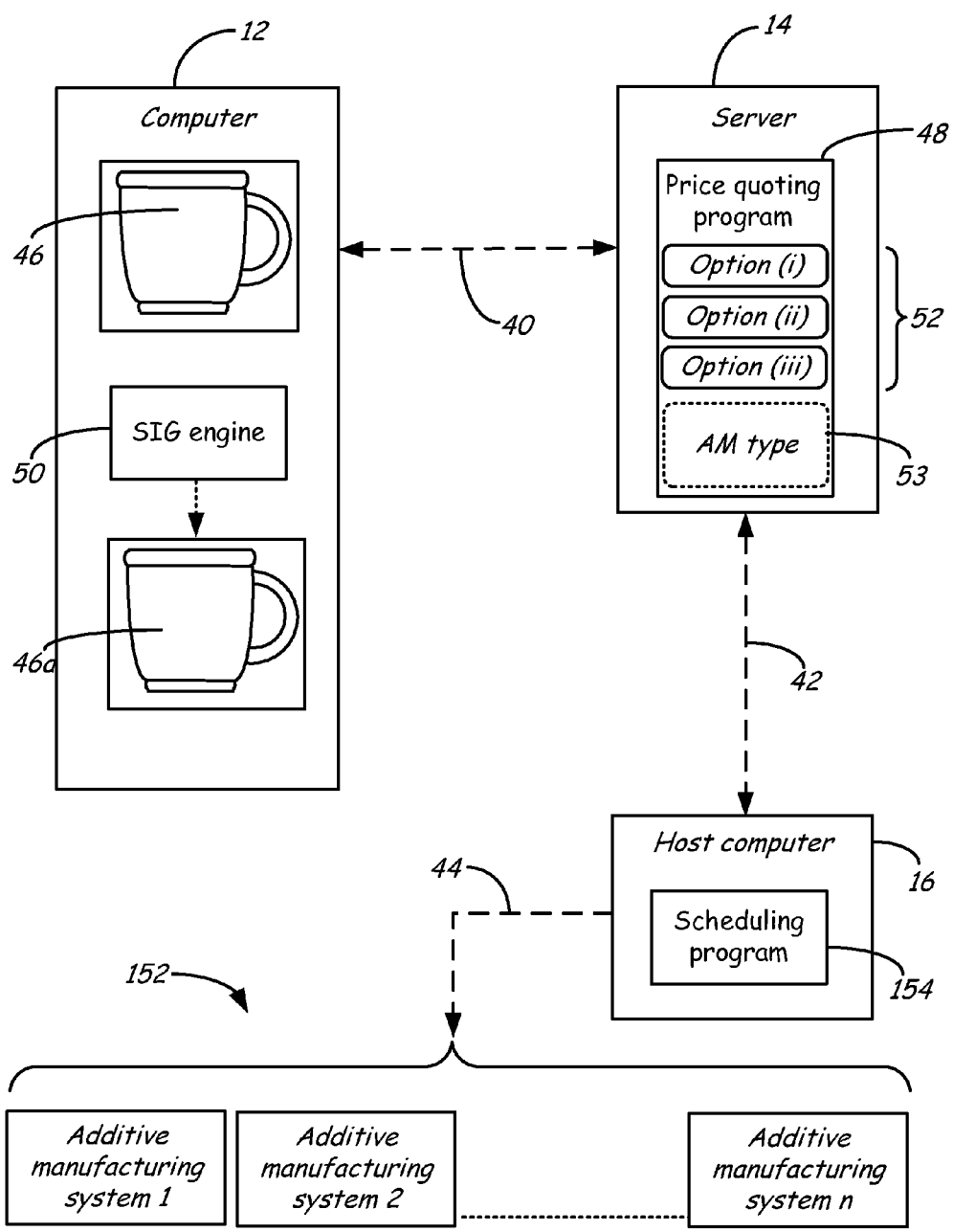
FIG. 17B is an alternative schematic illustration of the computer-based systems shown in FIG. 2B, illustrating the computer-based systems in use with a farm of additive manufacturing systems and a scheduling program.

For run-time and scheduling determinations, SIG engine 50 may also communicate with one or more scheduling programs. For instance, as shown in FIGS. 17A and 17B, which correspond respectively to the illustrations shown in FIGS. 2A and 2B, additive manufacturing service units (e.g., the on-demand service unit "REDEYE" of Stratasys, Inc., Eden Prairie, Minn.) may schedule time slots for printing jobs on farms of additive manufacturing systems, such as farm 152. These scheduled time slots are typically organized with scheduling programs, such as scheduling program 152 retained on host computer 16 (or alternatively on server 14 or other suitable computer-based system). Since the run times required to print or otherwise build 3D parts and support structures are also typically dependent on the volume of needed support material, SIG engine 50 may also export a run-time estimate based (at least in part) on the calculated support material volume to scheduling program 152.

The particular run times are also dependent on other factors, such as the type of additive manufacturing process used, the dimensions and complexities of the 3D parts, the part and support materials used, and the like. For example, a jetting-based additive manufacturing system may include a jetting head with an array of jetting orifices for printing part and support materials. The jetting head typically passes an entire printing surface area during each pass for deposition and curing, regardless of the amount of materials being deposited. As such, the run times for a jetting-based additive manufacturing system can be more dependent on the number of printed layers, rather than the amounts of material deposited per layer.

In comparison, the run times in an extrusion-based additive manufacturing system are based on tool paths. As such, the amounts of material deposited per layer can greatly affect the run times. Accordingly, the run times for a jetting-based additive manufacturing system are typically more consistent compared to those for an extrusion-based additive manufacturing system. Therefore, SIG engine 50 desirably accounts for these discrepancies between the different additive manufacturing processes when outputting run-times estimates to scheduling program 152.

In one embodiment, SIG engine 50 may function as a learning system, in which the run times for various additive manufacturing processes are recorded and compared to the calculated support material volumes to identify correlations. Based on these learned correlations, SIG engine 50 can then provide more accurate run-time estimates to scheduling program 152 for particular additive manufacturing processes.

The outputted run-time estimates from SIG engine 50 allow scheduling program 152 to then identify available time slots for printing a given 3D part, which may also affect the price quote. Thus, SIG engine 50 and scheduling program 152 may also communicate, together or independently, with price quoting system 48 to generate accurate price quotes, and optionally, run-time estimates.

Although the present disclosure has been described with reference to preferred embodiments, workers skilled in the art will recognize that changes may be made in form and detail without departing from the spirit and scope of the disclosure.

The invention claimed is:

1. A method for calculating a support material volume with a computer having one or more data storage devices, the method comprising:
   providing a tree data structure for a digital part on the one or more data storage devices;
   generating a grid of cells for the tree data structure with the computer, the cells defining a plurality of cell arrays;
   pinging the cells of one of the cell arrays with the computer until a cell containing a subset of the tree data structure is reached or until each cell in the cell array is pinged, wherein if a cell containing the subset of the tree data structure is reached, then designating the reached cell and all remaining unpinged cells in the cell array as filled;
   repeating the pinging step for each remaining cell array to determine a total filled volume; and
   subtracting, with the computer, a volume of the digital part from the total filled volume to determine a support material volume.

2. The method of claim 1, wherein the cell arrays each extend along a directional axis of a Cartesian coordinate system that is selected from the group consisting of a positive x-axis, a positive y-axis, a positive z-axis, a negative x-axis, a negative y-axis, and a negative z-axis.

3. The method of claim 1, wherein the tree data structure comprises a binary space partitioning tree.

4. The method of claim 1, and further comprising:
   identifying an additive manufacturing process to print a three-dimensional part based on the digital part; and
   modifying the determined support material volume based at least in part on the identified additive manufacturing process.

5. The method of claim 1, and further comprising generating a price quote based at least in part on the determined support material volume.

6. The method of claim 1, and further comprising generating a run-time estimate for printing a three-dimensional part and a support structure using an additive manufacturing process based at least in part on the determined support material volume.

7. The method of claim 1, and further comprising orienting the digital part based at least in part on the determined support material volume.

8. A method for manipulating a digital part with a computer having one or more data storage devices for use in an additive manufacturing process, the method comprising:
   (a) providing a grid of cells for a tree data structure of a digital part on the one or more data storage devices, the cells being organized in cell arrays along a plurality of directional axes;
   (b) selecting a first directional axis of the plurality of directional axes with the computer;
   (c) for each cell array along the first directional axis, pinging the cells of the cell array with the computer until a cell containing a subset of the tree data structure is reached;
   (c) designating, with the computer, the reached cell and all remaining unpinged cells in the cell array as filled;
   (d) repeating the steps (c) and (d) for each cell array along the remaining directional axes of the plurality of directional axes to determine a total filled volume for each of the plurality of directional axes;
   (e) subtracting, with the computer, a volume of the digital part from the total filled volume for each of the plurality of directional axes to determine a support material volume for each of the plurality of directional axes; and
   (h) identifying, with the computer, the directional axis having the lowest determined support material volume.

9. The method of claim 8, and further comprising orienting the digital part based on the identified directional axis having the lowest determined support material volume.

10. The method of claim 9, and further comprising exporting a second digital part that comprises the oriented digital part.

11. The method of claim 8, and further comprising designating at least one cell located adjacent to the reached cell as filled.

12. The method of claim 8, wherein the tree data structure comprises a binary space partitioning tree.

13. The method of claim 8, wherein the cells have substantially the same volumetric dimensions.

14. A price quoting method for use with a computer having one or more data storage devices in an additive manufacturing process, the price quoting method comprising:
   providing a tree data structure for a digital part to be printed with the additive manufacturing process on the one or more data storage devices;
   generating a grid of cells for the tree data structure with the computer, wherein the cells of the grid define a plurality of cell arrays;
   for each cell array, pinging the cells with the computer until a cell containing a subset of the tree data structure is reached or until an end cell of the cell array is pinged;
   designating all pinged cells containing subsets of the tree data structure and all unpinged cells as filled with the computer;
   summing volumes of the designated filled cells with the computer to provide a total filled volume;
   subtracting a volume of the digital part from the total filled volume with the computer to determine a support material volume; and
   generating a price quote based at least in part on the determined support material volume.

15. The price quoting method of claim 14, wherein the computer-based system comprises a first computer-based system, and wherein generating the price quote comprises:
   transmitting the provided support material volume from the first computer-based system to a second computer;
   calculating the price quote based at least in part on the determined support material volume; and
   transmitting the price quote from the second computer to the first computer.

16. The price quoting method of claim 14, wherein the tree data structure comprises a binary space partitioning tree.

17. The price quoting method of claim 16, and further comprising modifying the determined support material volume based at least in part on the additive manufacturing process, wherein the generated price quote is based at least in part on the modified support material volume.

18. The price quoting method of claim 16, and further comprising determining a run-time estimate for printing a three-dimensional part and a support structure using the additive manufacturing process based at least in part on the determined support material volume.

19. The price quoting method of claim 16, and further comprising:
   orienting the part based on the determined support material volume; and
   exporting a second digital part that comprises the oriented digital part.

20. The price quoting method of claim 19, wherein the second digital part further comprises digital support layers.

* * * * *